(12) United States Patent
Sharma

(10) Patent No.: US 10,991,435 B2
(45) Date of Patent: Apr. 27, 2021

(54) VERTICAL FLASH MEMORY CELL WITH SELECTOR FOR FAST READ

(71) Applicant: INTEL CORPORATION, Santa Clara, CA (US)

(72) Inventor: Abhishek A. Sharma, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/636,202

(22) PCT Filed: Sep. 29, 2017

(86) PCT No.: PCT/US2017/054326
§ 371 (c)(1),
(2) Date: Feb. 3, 2020

(87) PCT Pub. No.: WO2019/066905
PCT Pub. Date: Apr. 4, 2019

(65) Prior Publication Data
US 2020/0372957 A1    Nov. 26, 2020

(51) Int. Cl.
*G11C 16/26* (2006.01)
*G11C 16/04* (2006.01)
(Continued)

(52) U.S. Cl.
CPC .......... *G11C 16/26* (2013.01); *G11C 16/0466* (2013.01); *G11C 16/10* (2013.01); *H01L 27/11568* (2013.01); *H01L 29/7926* (2013.01)

(58) Field of Classification Search
CPC ..... G11C 16/26; G11C 16/0466; G11C 16/10; H01L 27/11568; H01L 29/7926
See application file for complete search history.

(56) References Cited

U.S. PATENT DOCUMENTS 8,592,789 B2 * 11/2013 Sasago ................ H01L 27/2436
257/2
9,093,170 B2 * 7/2015 Motwani ................ G11C 16/26
(Continued)

FOREIGN PATENT DOCUMENTS

WO    2015138119 A    9/2015
WO    2016066905 A1   4/2019

OTHER PUBLICATIONS

International Search Report and Written Opinion received for PCT Application No. PCT/US2017/054326, dated Jun. 28, 2018. 17 pages.

*Primary Examiner* — Vanthu T Nguyen
(74) *Attorney, Agent, or Firm* — Schwabe, Williamson & Wyatt, P.C.

(57) ABSTRACT

A vertical flash device (e.g., such as a field effect transistor, charge trap gate transistor, or charge trap flash device) is placed in series with a selector device. The selector's threshold voltage may be modulated depending upon the channel resistance of the flash device allowing for the storage of a state via the selector device. In this manner, the selector device may exhibit a voltage-dependent volatile resistance state change that occurs between a first state of said selector device and a second state of said selector device. A first binary value can be represented by the first state of the selector device, and a second binary value can be represented by the second state of the selector device.

20 Claims, 19 Drawing Sheets

(51) Int. Cl.
  *G11C 16/10* (2006.01)
  *H01L 27/11568* (2017.01)
  *H01L 29/792* (2006.01)

(56) References Cited

U.S. PATENT DOCUMENTS

| | | | |
|---|---|---|---|
| 9,230,985 B1 | 1/2016 | Wu et al. | |
| 9,947,404 B1* | 4/2018 | Park | G11C 13/004 |
| 10,157,671 B1* | 12/2018 | Lung | G11C 13/0023 |
| 10,224,200 B2* | 3/2019 | Park | H01L 27/2463 |
| 2005/0280061 A1 | 12/2005 | Lee | |
| 2009/0242965 A1 | 10/2009 | Park et al. | |
| 2012/0074368 A1* | 3/2012 | Sasago | H01L 27/1021 |
| | | | 257/2 |
| 2016/0012886 A1 | 1/2016 | Nazarian et al. | |

\* cited by examiner

VERTICAL FLASH MEMORY CELL WITH SELECTOR FOR FAST READ

CROSS REFERENCE TO RELATED APPLICATIONS

This application is a U.S. national stage entry under 35 U.S.C. § 371(c) of International Application No. PCT/US17/54326, filed Sep. 29, 2017, the disclosure of which is incorporated by reference herein in its entirety.

BACKGROUND eDRAM ("Enhanced Dynamic Random Access Memory") and eSRAM ("Enhanced Static Random Access Memory") consume a significant area because they are transistor pitch limited. It is desirable to conserve area, especially in the front-end. For this reason, vertical transistors may be employed. Thus, to build compact memory structures, it is desirable to leverage a physical property that is suitable for such structures.

Floating gate ("FG") flash memory is an electronic (solid-state) non-volatile computer storage medium that can be electrically erased and reprogrammed. In FG flash memory, each memory cell resembles a standard MOSFET, except that the transistor has two gates instead of one. On top is the control gate ("CG"), as in other MOS transistors, but below this there is a floating gate ("FG") insulated all around by an oxide layer. The FG is interposed between the CG and the MOSFET channel. Because the FG is electrically isolated by its insulating layer, electrons placed on it are trapped until they are removed by another application of electric field (e.g. Applied voltage or UV as in EPROM). A logical '0' or '1' state may be achieved respectively either by the presence or absence electrons on the floating gate. Counter-intuitively, placing electrons on the FG sets the transistor to the logical "0" state. Once the FG is charged, the electrons in it screen (partially cancel) the electric field from the CG, thus, increasing the threshold voltage ($V_t$) of the cell.

Charge Trap Flash ("CTF") is a semiconductor memory technology used in creating non-volatile NOR and NAND flash memory. The technology differs from the more conventional floating-gate MOSFET technology in that it uses a silicon nitride film to store electrons rather than the doped polycrystalline silicon typical of a floating gate structure. This approach allows memory manufacturers to reduce manufacturing costs several ways: fewer process steps are required to form a charge storage node; smaller process geometries can be used (therefore reducing chip size and cost); multiple bits can be stored on a single flash memory cell. CTF typically is more reliable than FG flash. It also generally has a higher yield since the charge trap is less susceptible to point defects in the tunnel oxide layer

DETAILED DESCRIPTION

Structures and techniques are disclosed for vertical flash memory cells configured with a selector for fast read. According to one embodiment of the present disclosure, a flash device is placed in series with a selector device. The flash device may be, for example, a charge trap gate transistor or charge trap flash device. The selector device's threshold voltage changes depending upon the channel resistance of the flash device. This arrangement can be viewed as 2 resistors in series such that because of the presence of a variable (either relatively small or relatively large) transistor channel resistance in series with the selector, the selector is either activated or deactivated based on the channel resistance and the voltage divider effect. Numerous configurations and variations will be apparent in light of this disclosure.

Figure 1:
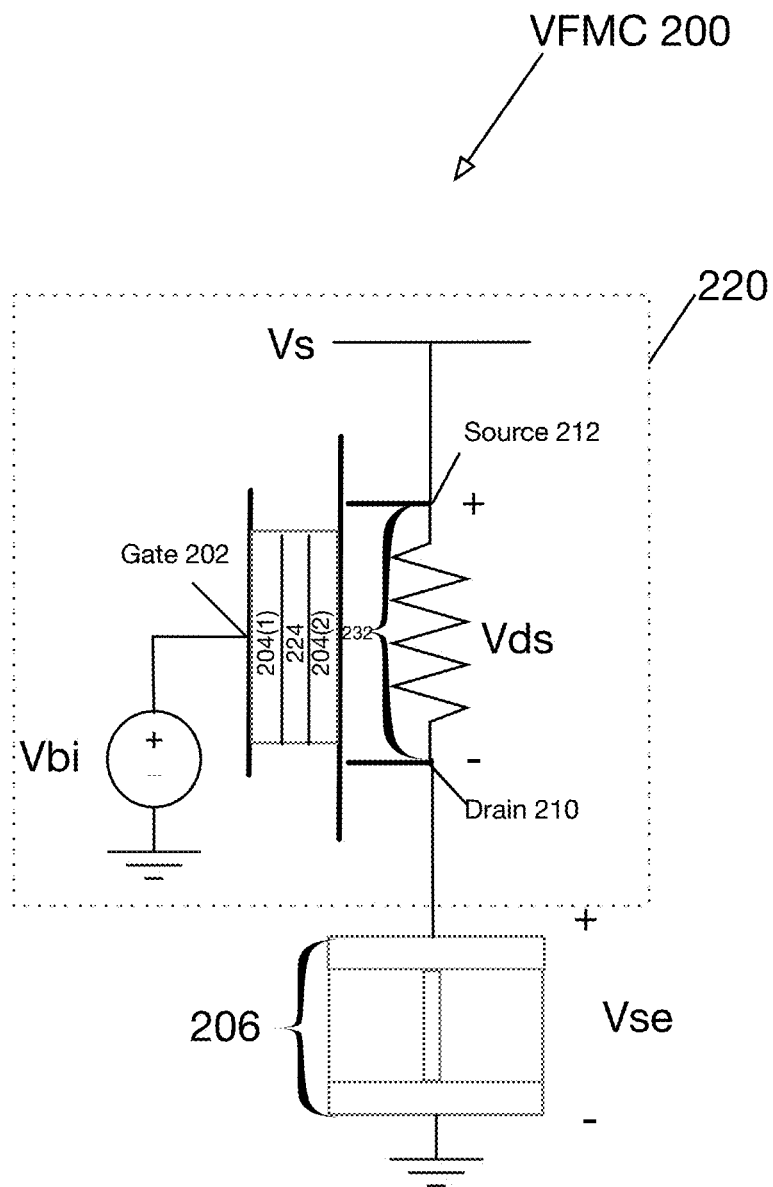
FIG. 1 is a schematic of a vertical flash memory cell according to one embodiment of the present disclosure.

FIG. 1 is a schematic of a vertical flash memory cell ("VFMC") according to one embodiment of the present disclosure. As shown in FIG. 1, VFMC 200 further comprises charge trap vertical transistor ("CTVT") 220 and selector device 206. Selector device 206 may be any device that exhibits a voltage-dependent volatile resistance state change (described below). CTVT 220 may include channel 232, gate 202, drain 210, source 212, gate oxide layer 204(1), tunneling oxide layer 204(2) and charge trap layer 224.

It will be understood that a sufficient voltage established across gate 202 to source 212 causes the formation of a conductive channel 232 (shown in FIG. 1 for convenience). It will be further understood that channel 232 is ephemeral and only appears if the absolute value of the voltage across gate 202 and source 212 is sufficient to exceed a threshold voltage $V_t$ and that channel 232 disappears if the absolute value of the voltage between gate 202 and source 212 falls below a threshold voltage $V_t$.

As will become evident in the discussion below, charge trap layer 224 between gate oxide 204(1) and tunneling oxide 204(2) allows for a persistent built-in voltage/built-in charge to be established across gate 202 to source 212 of CTVT 220 via the quantum mechanical tunneling of charge carriers from channel 232 through either gate oxide layer 204(1) or the tunneling of charge carriers from channel 232 through tunneling oxide layer 204(2) to charge trap layer 224. The introduction of a net charge in charge trap layer 224 and thereby the establishment of a persistent built-in voltage/built-in charge $V_{bi}/Q_{bi}$ may be controlled by driving gate 202 with a large positive voltage. Conversely, a neutralization of a net charge (via electron-hole recombination) in the charge trap layer 223 of CTVT 220 may be caused by driving gate 202 with a large negative voltage. Thus, through this mechanism, a persistent net charge may be introduced or removed in charge trap layer 224. The control of a persistent net charge or absence thereof in charge trap layer 224 allows for the modulation of a persistent built-in voltage or charge $V_{bi}/Q_{bi}$ across gate 202 to source 212.

Gate oxide layer 204(1) prevents the leakage of trapped charge in charge trap layer 224 from leaking into gate 202. The persistent built-in voltage/charge $V_{bi}/Q_{bi}$ across gate 202 to source 212 modulates the conductivity across the source 212 to drain 210 (via channel 232) based upon an effective threshold voltage $V_{t-eff}$ of CTVT 220. That is, the persistent $V_{bi}/Q_{bi}$ across gate 202 to source 212 of CTVT 220 modulates the inherent threshold voltage $V_t$ of CTVT 220, thereby generating an effective threshold voltage $V_{t-eff}$ in CTVT 220. This $V_{t-eff}$ may cause CTVT 220 to be on (source-drain highly conductive) even at zero bias or off depending respectively whether $V_{bi}>0$ or $V_{bi}<0$.

Channel 232 may either be N-type material or P-type material. In embodiments, the first channel 232 an N-type channel material or a P-type channel material. An N-type channel material may include indium tin oxide (ITO), indium gallium zinc oxide (IGZO), indium zinc oxide (IZO), aluminum-doped zinc oxide (AZO), amorphous silicon, zinc oxide, amorphous germanium, polysilicon, poly germanium, or poly-III-V like InAs. On the other hand, a P-type channel material may include amorphous silicon, zinc oxide, amorphous germanium, polysilicon, poly germanium, poly-III-V like InAs, copper oxide (CuO), or tin oxide (SnO). Channel 232 may have a thickness in a range of about 10 nm to about 100 nm. In addition to these, the vertical transistor could be a single crystal variant of any of these materials listed above.

Due to the voltage divider between CTVT 220 and selector device 206, one of two states (ON-state or OFF-state) of selector device 206 may be selected depending upon whether channel 232 of CTVT 220 is in a low or high conductive state. In particular, if channel 232 of CTVT 220 is highly conductive, most of $V_s$ falls across selector device 206 causing it to be in an ON-state. On the other hand, if the channel 232 of CTVT 220 is highly resistive, most of the voltage falls across CTVT 220 causing selector device 206 to be in an OFF-state. The structure of selector device 206 will be described below.

During a write operation (described in detail below), a shift in $V_t$ of CTVT 220 to achieve $V_{t-eff}$ may be caused by applying a large positive or negative voltage at gate 102 of CTVT 220, which causes the introduction of a net positive charge in charge trap layer 224. Applying a large negative voltage across gate 202 to source 212 will cause the removal of any persistent net charge in charge trap layer 224. Thus, applying a large positive voltage or a large negative voltage at gate 102 of CTVT 220 will either switch selector device 206 to an ON-state or an OFF-state respectively.

During a read operation (described in detail below), a small voltage $V_{DS}$ may be applied across source 212 to drain 210 (channel 232) to detect a current across source 212 to drain 210 and hence the conductivity across channel 232, indicating whether selector device 206 is in either an ON-state or an OFF-state.

Figure 2A:
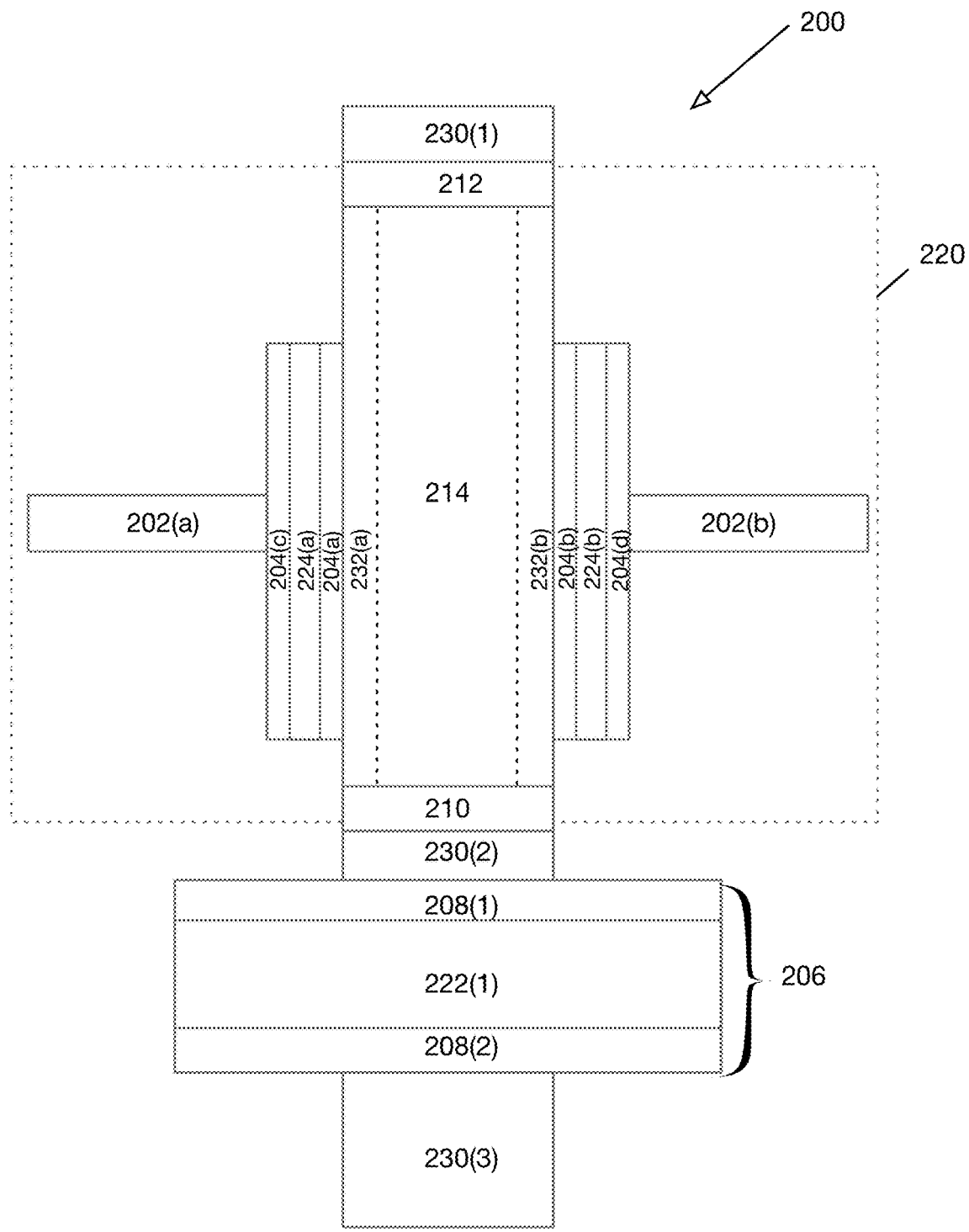
FIG. 2a is a detailed cross-sectional view of a vertical flash memory cell utilizing a single selector device according to one embodiment of the present disclosure.

FIG. 2a is a detailed cross-sectional view of a VFMC utilizing a single selector device according to one embodiment of the present disclosure. As shown in FIG. 2a, VFMC 200 further comprises CTVT 220 and selector device 206. According to one embodiment of the present disclosure, CTVT 220 may be a vertical nanowire surround-gate field-effect transistor ("VS-FET") that is modified to include charge trap layer 224(a)-224(b) fabricated between gate oxide layer 204(b)-204(c) as well as tunneling oxide layer 204(a)-204(b). CTVT 220 may assume a cylindrical form in which gate oxide layer 204(b)-204(c) comprises an outer layer of the cylindrical form wrapping charge trap layer 224(a)-224(b), which wraps tunneling oxide layer 204(a)-204(b), which in turn wraps semiconductor 214.

The structure and function of selector device 206 will be described below with respect to FIG. 4. For purposes of the present discussion, it is sufficient to recognize that selector device 206 may be a 2-terminal device that exhibits a voltage-dependent volatile resistance state change.

As shown in FIG. 2a, CTVT 220 may further comprise gate 202(a)-202(b), source 212 and drain 210, gate oxide layer 204(b)-204(c), tunneling oxide layer 204(a)-204(b), charge trap layer 224(a)-224(b) and semiconductor 214. As FIG. 2a is a cross-sectional view, it will be understood that gate 202(a)-204(b) wraps gate oxide layer 204(c)-202(d). Gate oxide layer 204(c)-204(d) wraps charge trap layer 224(a)-224(b), which in turn wraps tunneling oxide layer 204(a)-204(b). Tunneling oxide layer 204(a)-204(b) wraps semiconductor 214. Semiconductor 214 is electrically coupled to drain 210 and source 212. As will be understood, conductive channel 232(a)-232(b) may be introduced in semiconductor 214 depending upon whether a voltage across gate 202(a)-202(b) and source 212 exceeds a threshold voltage $V_t$.

According to one embodiment of the present disclosure, gate 202(a)-204(b), drain 210 and source 212 may all be composed of metal. CTVT 220 is coupled via source 212 to voltage source $V_s$ via metal 230(1). CTVT 220 is coupled to selector device 206 via drain 210 via metal 230(2).

Gate oxide layer 204(c)-202(d) may be of identical composition to tunneling oxide layer 204(a)-204(b) and may exhibit an identical or different thickness. Gate oxide layer 204(c)-204(d) prevents leakage of carriers from charge carriers in charge trap layer 224(a)-224(b) to gate 202(a)-202(b). Tunneling oxide layer 204(a)-204(b) may comprise an oxide layer or other insulating material. According to one embodiment of the present disclosure, tunnel oxide layer 204(a)-204(b) exhibits a thickness of between 0.5 nm to 10 nm. Tunneling oxide layer 204(a)-204(b) may be, for example, silicon dioxide ($SiO_2$), sulphur fluorine oxide ($SFO_2$), protactinium oxide ($Pa_2O_5$), titanium oxide ($TiO_2$), aluminum oxide ($Al_2O_3$), gallium oxide ($Ga_2O_3$), yttrium oxide ($Y_2O_3$), aluminum nitride (AlN).

Charge trap layer 224(a)-224(b) may comprise a plurality of charge traps and may also an insulating layer such as an oxide. As will be understood, charge traps are effectively available states in the bandgap of charge trap layer 224(a)-224(b) that may be occupied by carriers such as electrons. That is, charge carriers that have tunneled through either gate oxide layer 204(b)-204(c) or tunneling oxide layer 204(a)-204(b) may bond themselves locally to the lattice of charge trap layer 224(a)-224(b). According to one embodiment of the present disclosure, charge trap layer 224(a)-224(b) may comprise silicon nitride (SiN), titanium oxide ($TiO_2$), aluminum nitride (AlN), silicon oxynitride (SiON), aluminum oxynitride (AlON), tantalum oxide (TaOx) (x=1-2.5), aluminum silicon nitride (AlSiN), aluminum silicon oxynitride (AlSiON). To introduce charge traps, charge trap layer may be a substoichiometric layer with electron or hole traps.

Upon the introduction of a large voltage across gate 202(a)-202(b) and source 212, and a large voltage between drain 210 and source 212, charge carriers may quantum mechanically tunnel from channel 232(a)-232(b) through tunneling oxide layer 204(a)-204(b) via hot carrier injection to charge trap layer 224(a)-224(b) where they may become trapped. Or, charge carriers may quantum mechanically tunnel from gate 202(a)-202(b) through gate oxide layer 204(b)-204(c) to charge trap layer 224(a)-224(b) simply by applying a large voltage between gate 202 and source 212.

Trapped carriers in charge trap layer 224(a)-224(b) may function similarly to bound charge in a dielectric material. However, in this case the charges trapped in charge trap layer 224(a)-224(b) are free charges. This introduces an associated built-in charge $Q_{bi}$ and associated built-in voltage $V_{bi}$ between gate 202(a)-202(b) and source 212.

As shown in FIG. 2a, where only one selector device 206 is utilized an instantaneous change in the voltage at 230 may cause via parasitic coupling through the gate oxide layer 204(b)-204(c) into gate 202(a)-202(b). This effect may cause adverse effects during read operations (sensing of the data).

Figure 2B:
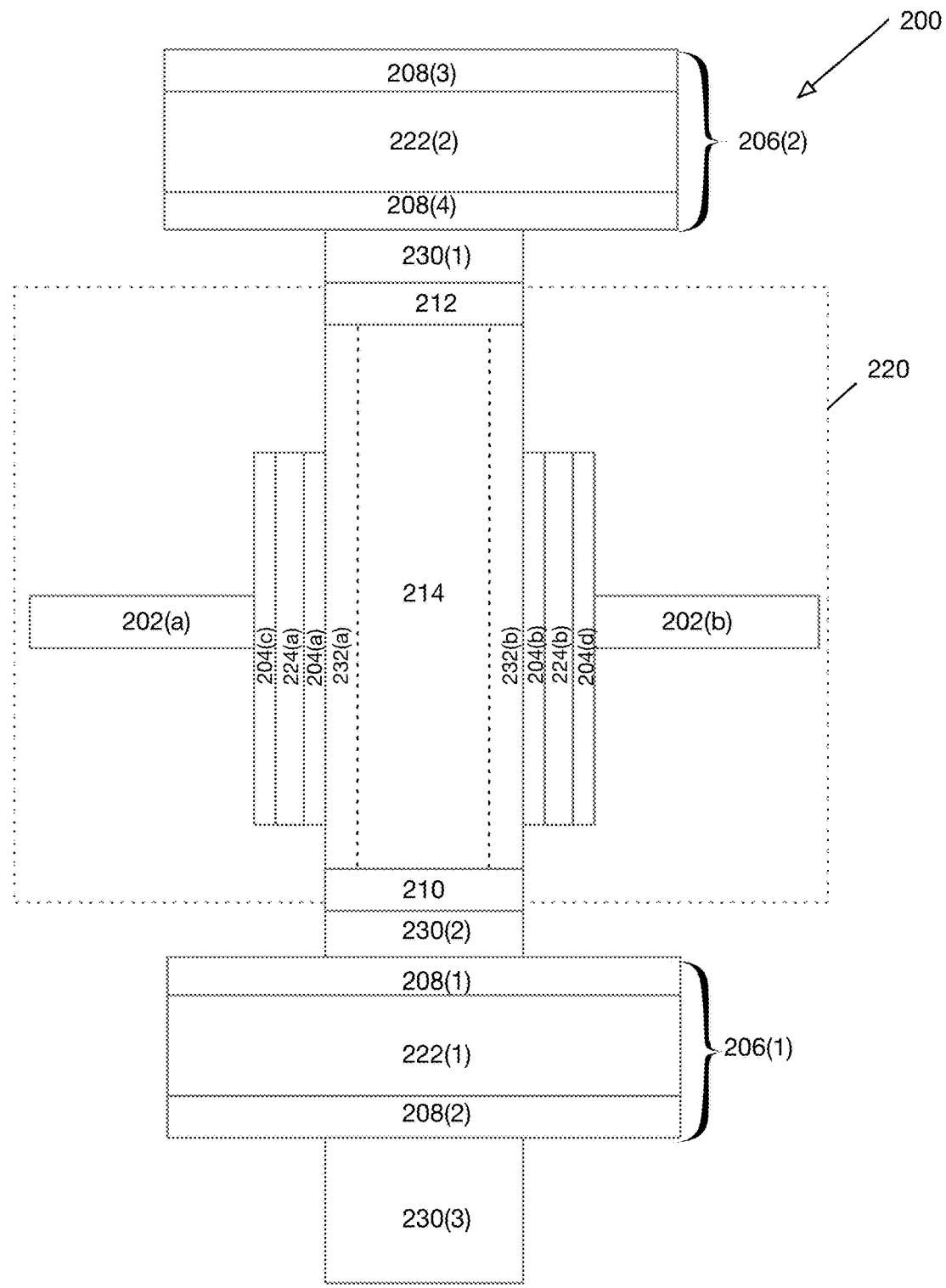
FIG. 2b is a detailed cross-sectional view of a vertical flash memory cell utilizing two selector devices according to one embodiment of the present disclosure.

FIG. 2b is a detailed cross-sectional view of a VFMC utilizing two selector devices according to one embodiment of the present disclosure. Compared with the embodiment shown in FIG. 2a, this embodiment provides isolation from effects such as a corruption during read operations due to parasitic coupling from instantaneous changes in voltage during read operations.

Figure 3A:
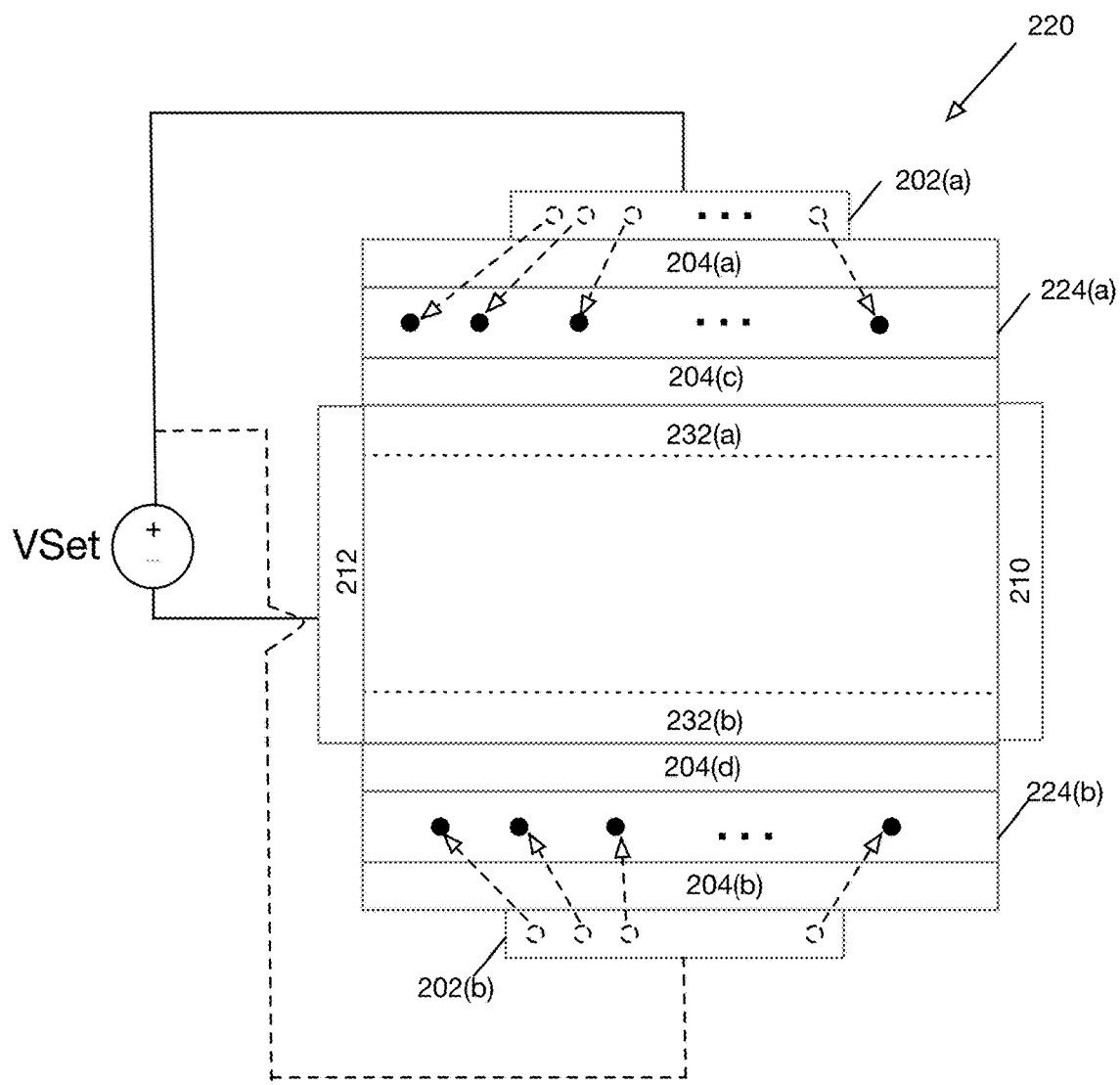
FIG. 3a depicts an operation for setting a charge trap vertical transistor to an ON-state via quantum mechanical tunneling of charge carriers from a gate to a charge trap layer according to one embodiment of the present disclosure.

FIG. 3a depicts an operation for setting a CTVT to an ON-state via quantum mechanical tunneling of charge carriers from a gate to a charge trap layer according to one embodiment of the present disclosure. FIG. 3a is cross-sectional view, similar to FIGS. 2a-2b, except rotated 90 degrees.

It will be understood that quantum mechanical tunneling or tunneling refers to the quantum mechanical phenomenon where a particle tunnels through a potential energy barrier that it classically could not surmount. Quantum tunneling may be understood to occur because the wave function for a particle such as an electron may have a non-zero value even in regions where the energy of the particle described by the wave function is lower than the associated potential energy function within that region. Particles may "tunnel" through the classically disallowed region to a second region in which their associated energy exceeds the associated potential energy function in the second region. Thus, because the wave function is non-zero in the second region, a particle has a finite probability (the modulus squared of the wave function associated with that particle) in appearing at any given point in the second region upon performing an observation or measurement.

As shown in FIG. 3a, a very large positive voltage $V_{set}$ may be applied between gate 202(a)-202(b) and source 212. This large positive voltage may allow charge carriers (i.e., electrons) in gate 202(a)-202(b) to acquire enough energy to tunnel across gate oxide region 204(a)-204(b) into charge trap layer 224(a)-224(b), where the charges (i.e., electrons) become trapped. The trapped charge carriers in charge trap layer 224(a)-224(b) introduce a persistent built-in charge $Q_{bi}$ and associated built-in voltage $V_{bi}$ between gate 202(a)-202(b) and source 212 leaving CTVT 220 in a persistent ON-state.

Figure 3B:
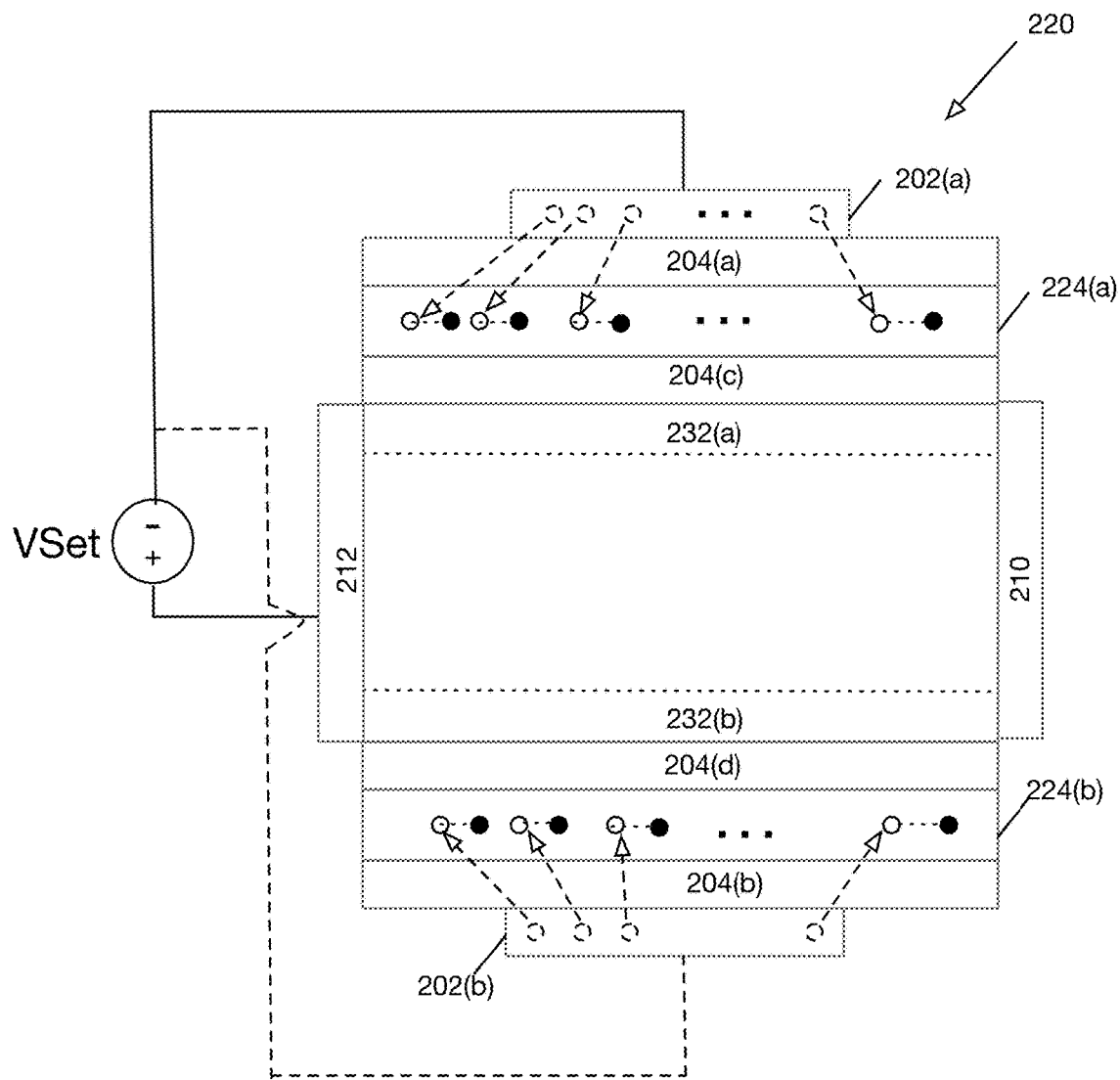
FIG. 3b depicts an operation for setting a CTVT to an OFF-state via quantum mechanical tunneling of charge carriers from a gate to a charge trap layer and recombination according to one embodiment of the present disclosure.

FIG. 3b depicts an operation for setting a CTVT to an OFF-state via quantum mechanical tunneling of charge carriers from a gate to a charge trap layer and recombination according to one embodiment of the present disclosure. As shown in FIG. 3a, a very large negative voltage $V_{set}$ may be applied between gate 202(a)-202(b) and source 212. This large negative voltage may allow complementary charge carriers (i.e., holes) in gate 202(a)-202(b) to acquire enough energy to tunnel across gate oxide region 204(a)-204(b) into charge trap layer 224(a)-224(b), where they may recombine with the trapped electrons, effectively neutralizing $Q_{bi}$ and the associated built-in voltage $V_{bi}$. This operation leaves CTVT 220 in an OFF-state.

Figure 3C:
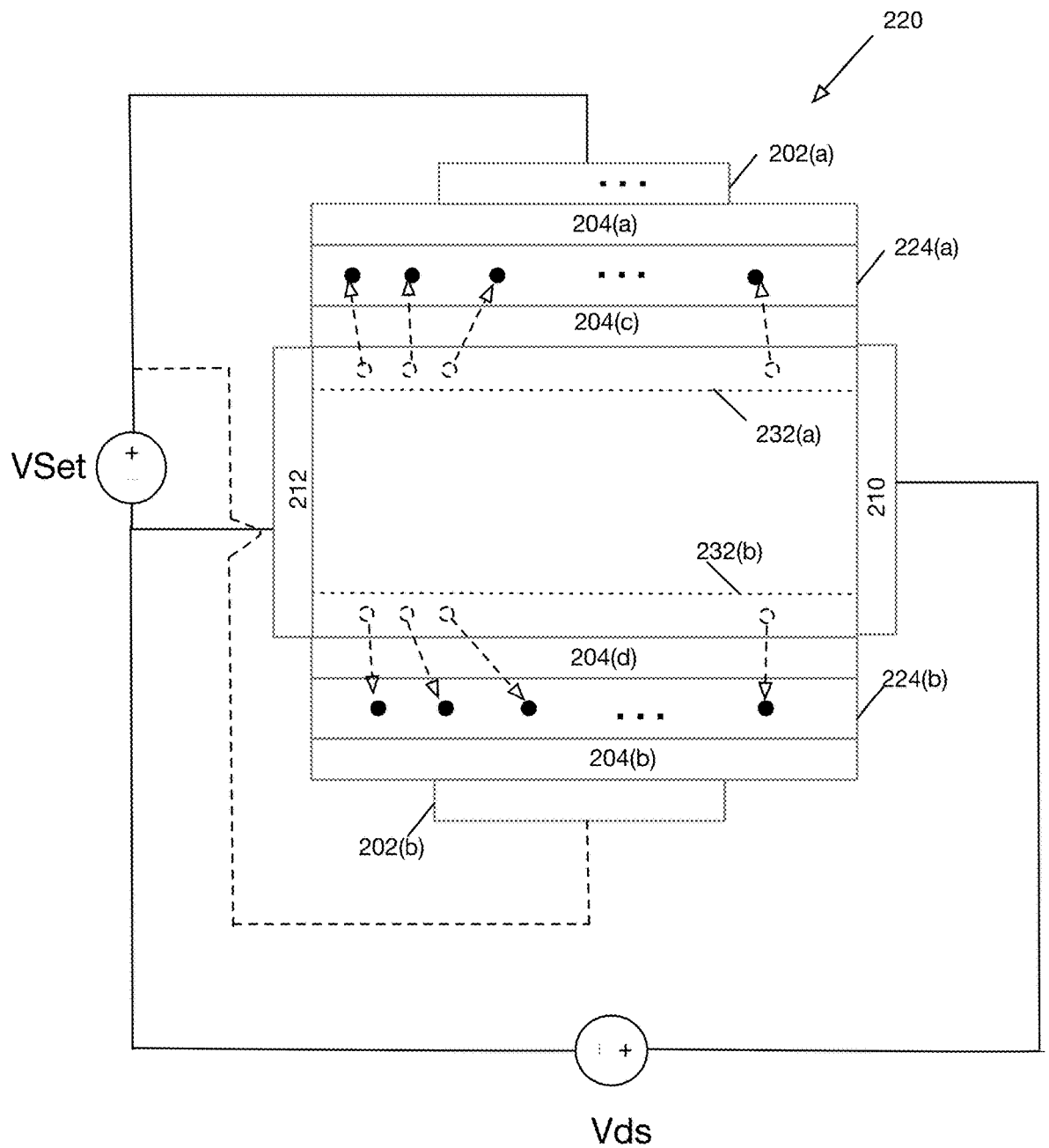
FIG. 3c depicts a quantum mechanical tunneling of charge carriers from a channel to a charge trap layer in a CTVT according to one embodiment of the present disclosure.

FIG. 3c depicts a quantum mechanical tunneling of charge carriers from a channel to a charge trap layer in a CTVT according to one embodiment of the present disclosure. As shown in FIG. 3c, a very large positive voltage $V_{set}$ may be applied between gate 202(a)-202(b) and source 212 causing the formation of channel 232(a)-232(b). In addition, a large positive voltage $V_{DS}$ may be applied between drain 210 and source 212. This large positive voltage $V_{DS}$ may allow charge carriers (i.e., electrons) in channel 232(a)-232(b) to acquire enough energy to tunnel across tunneling oxide layer 204(c)-204(d) into charge trap layer 224(a)-224(b), where the charges (i.e., electrons) become trapped. This mechanism is known as hot carrier injection. The trapped charge carriers in charge trap layer 224(a)-224(b) introduce a persistent built-in charge $Q_{bi}$ and associated built-in voltage $V_{bi}$ between gate 202(a)-202(b) and source 212 leaving CTVT 220 in a persistent ON-state.

Selector (Threshold Switching Device)

Figure 4:
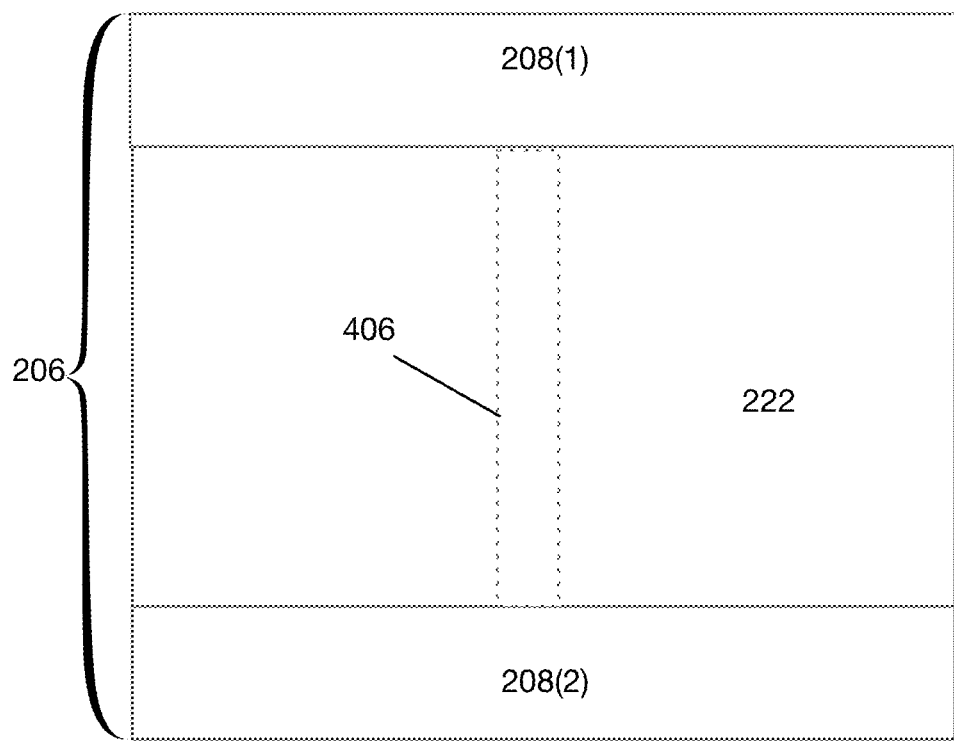
FIG. 4 depicts a structure of a selector device according to one embodiment of the present disclosure.

FIG. 4 depicts a structure of a selector device according to one embodiment of the present disclosure. Selector device 206 may be any 2-terminal device that exhibits a voltage-dependent volatile resistance state change. According to one embodiment of the present disclosure, when a voltage across selector device 206 exceeds a pre-determined value herein referred to as the threshold voltage (not the same threshold voltage $V_t$ associated with CTVT 220), the resistance of selector device 206 is reduced to a very or otherwise relatively low value. Characteristic I-V curves for selector device 206 is described below with respect to FIGS. 5a-5g.

Threshold Voltage, Holding Voltage and Filament

As previously noted, selector device 206 may be any 2-terminal device that shows a voltage dependent volatile resistance state change. Selector device 206 may comprise a resistive random-access memory ("RRAM" or "ReRAM"), which may be any type of non-volatile ("NV") random-access ("RAM") computer memory that operates by changing the resistance across a dielectric solid-state material often referred to as a memristor.

Certain disordered glasses (including polycrystalline films with defects) like chalcogenides and some oxides show a characteristic bistability in their resistance states. Several mechanisms have been advanced to explain this change in conductivity ranging from carrier injection, field-driven nucleation and growth of conducting laments, insulator-metal transitions, and so on. Despite the variety in the physical mechanisms, all of the theories agree that as the voltage across a device composed of such elements is increased, the current through the device undergoes a localization process that is concurrent with a drop-in device resistance and is accompanied by a negative differential resistance regime in the device I-V characteristic.

In particular, according to one embodiment of the present disclosure, selector device 206 may comprise a dielectric, which is non-conductive (insulating) in a first state and conductive in a second state. A conductive state may be generated through the formation of a filament 406 or conduction path, which is generated after application of a sufficiently high voltage across selector device 206. Note that filament 406 is shown in FIG. 4 using dotted lines to indicate its transitory nature.

Filament 406 may arise from different mechanisms, including vacancy or metal defect migration. Once filament 406 is formed, it may be reset (broken, resulting in high resistance) or set (re-formed, resulting in lower resistance) by another voltage. The low-resistance path can be either localized (filamentary) or homogeneous. Both effects can occur either throughout the entire distance between the electrodes or only in proximity to one of the electrodes.

According to one embodiment of the present disclosure, when an applied voltage across selector device 206 exceeds a certain value known as a threshold voltage $V_t$, the resistance of selector device 206 is reduced to a low value, which occurs due to the formation of filament 406. This high conductivity (low resistance) state may be maintained so long as the voltage across selector device 206 is higher than a holding voltage $V_h$ (described below). On the other hand, when the voltage across selector device 206 is reduced below $V_h$, the resistance across selector device 206 returns to an insulating or resistive state and filament 406 is dissolved.

Example Selector Materials

According to one embodiment selector device 202 may comprise an oxide/semiconductor 304 sandwiched between a first 302(a) and second 302(b) metal layer. According to alternative embodiment, any other materials that exhibit a volatile resistance state change may be utilized for element 304. For example, other materials that exhibit a volatile resistance state change include niobium dioxide (NbO2), tantalum oxide (TaOx), vanadium dioxide (VO2), nickel oxide (NiO), chalgogenides such as titanium (Ti), tellurium (Te), arsenic (As), germanium (Ge), hafnium tantalum oxide (HfTaOx), hafnium niobium oxide (HfNbOx), hafnium nickel oxide (HfNiOx), niobium tantalum oxide (NbTaOx), and nickel tantalum oxide (NiTaOx). Other comparable or otherwise suitable materials will be apparent in light of this disclosure Multiple inorganic and organic material systems display thermal or ionic resistive switching effects. Example materials include phase-change chalcogenides such as germanium-antimony-tellurium (GeTe-Sb2-Te3) or silver-indium-antimony-tellurium (AgInSbTe), binary transition metal oxides such as NiO or titanium oxide (TiO), perovskites such as strontium zirconium titanate (Sr(Zr)TiO3) or PCMO, solid-state electrolytes such as germanium sulfide (GeS), germanium selenide (GeSe), silicon oxide (SiOx) or copper sulfide (Cu2S).

According to one embodiment of the present disclosure, metal layers 208(1)-208(2) may exhibit a thickness of between 2 and 50 nm. Oxide semiconductor layer 222 may exhibit a thickness of between 5-80 nm. In particular, for low voltage applications less than 1.5 volts, oxide semiconductor layer 222 thickness may be between 5-20 nm and for high voltage applications (1.5-3.3 volts), oxide semiconductor 222 thickness may be between 20-80 nm.

Figure 5A:
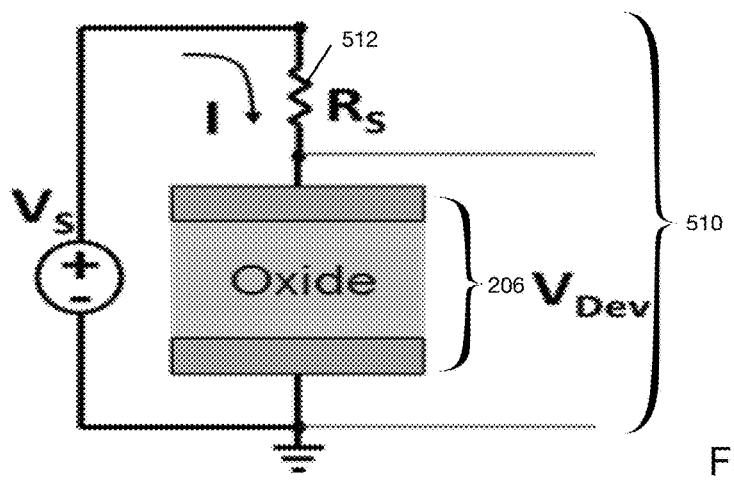
FIG. 5a shows a circuit schematic of a selector device in series with a resistive element, according to an embodiment of the present disclosure.

FIG. 5a shows a circuit schematic of a selector device in series with a resistive element, according to an embodiment of the present disclosure. A voltage source $V_s$ may be applied across resistor-selector pair 510. As will be described below, resistor-selector pair 510 further comprising resistor 512 and selector device 206 may exhibit oscillatory or non-oscillatory behavior depending upon a bias voltage (i.e., $V_s$).

Figure 5B:
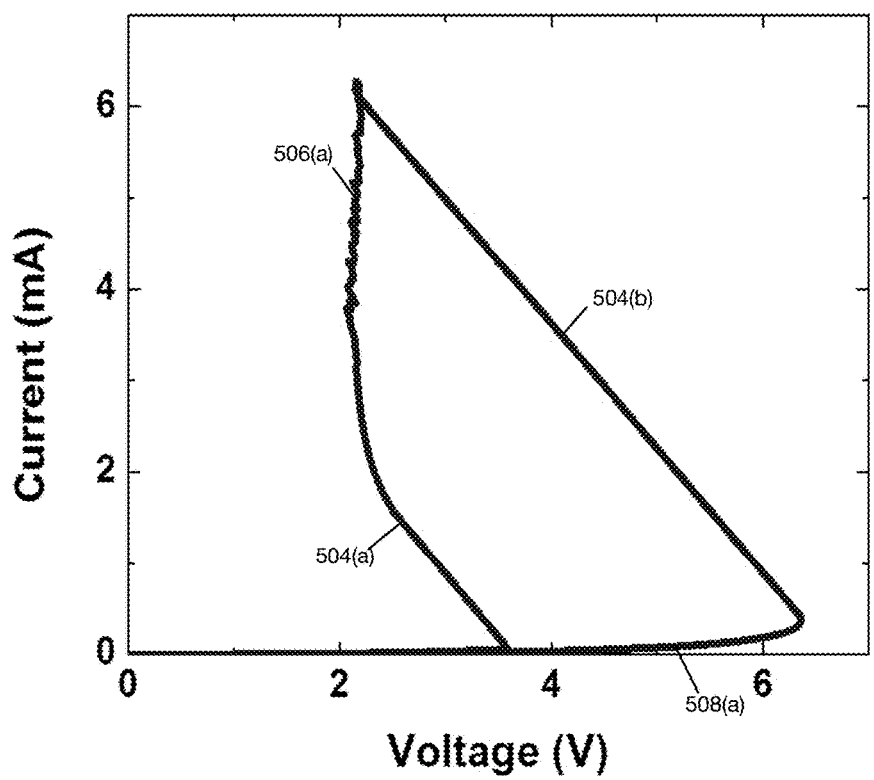
FIG. 5b shows an I-V characteristic of a selector device showing a metastable ON-state when stressed with a triangular pulse, according to one embodiment of the present disclosure.

FIG. 5b shows an I-V characteristic of a selector device showing a metastable ON-state when stressed with a triangular pulse, according to one embodiment of the present disclosure. As shown in FIG. 5b, the I-V curve shown may be characterized by four (4) regimes. OFF-state regime 508(a) is a high resistance state (i.e., dV/dI is high). ON-state regime 506(a) is a low resistance state $$\left(\text{i.e., } \frac{dV}{dI} \text{ is low}\right).$$

Regimes 504(a)-504(b) are negative differential resistance ("NDR") states $$\left(\text{i.e., } \frac{dV}{dI} < 0\right).$$

In OFF-state regime 508(a), as the bias across the device-resistance pair 510 (206 and 512) is slowly increased, the current through selector device 206 increases and eventually, at a threshold voltage, selector device 206 enters negative differential resistance regime 504(b). This implies that selector device 206 forms conductive filament 406 (shown in FIG. 4) as it enters negative differential resistance (NDR) and this abrupt reduction in resistance induced by the formation of conductive filament 406 is responsible for the differential resistance becoming negative in NDR regime 504(a).

Depending on the overdrive-voltage (differential voltage beyond the threshold voltage) applied to selector device 206, selector device 206 may settle down to various low-resistance states, or ON-state regimes 506(a) (described below).

ON-state regime 506(a) may be completely volatile (corresponding to a volatile filament 406), and selector device 206 may revert to OFF-state regime 508(a) (filament 406 dissolved), once the voltage is removed. The voltage and current associated with this reversal and dissolution of filament 406 is designated as the holding voltage $V_h$ and holding current $I_h$. Thus, when a voltage across selector device 206 falls below $V_h$, filament 406 is dissolved.

Figure 5C:
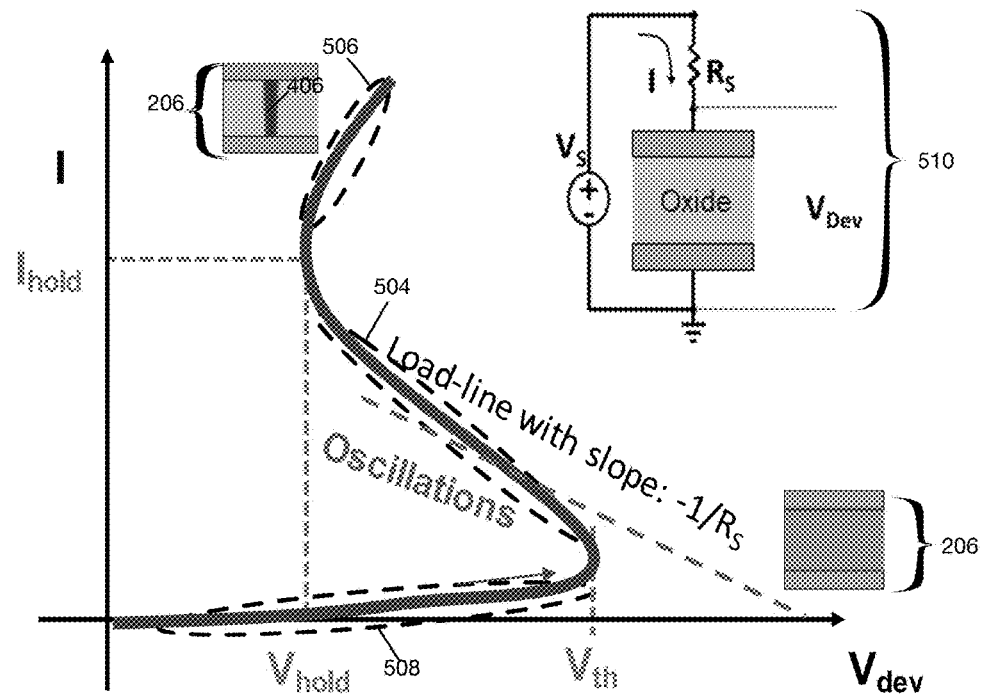
FIG. 5c shows an I-V curve of a selector device in relation to an ON-state and an OFF-state along with associated presence or non-presence of a filament according to one embodiment of the present disclosure.

FIG. 5c shows an I-V curve of a selector device in relation to an ON-state and an OFF-state along with associated presence or non-presence of a filament according to one embodiment of the present disclosure. As shown in FIG. 5c, the I-V curve exhibits S-type negative differential resistance. The term S-type refers to the fact that the I-V curve is shaped like the letter 'S'. For purposes of this discussion, differential resistance will be understood to be the derivative of the voltage with respect to the current $$r_{diff} = \frac{dv}{di}.$$

Points on the I-V curve where the slope is negative indicate that an increase in voltage results in a decrease in current, thus defining a negative differential resistance ($r_{diff}<0$).

FIG. 5c shows three distinct regions of operation, ON-state 506 characterized by low voltage, high current and low resistance (high conductivity), OFF-state 508 characterized by high voltage, low current and high resistance (low conductivity) and negative differential ("NDR") region 504, which is unstable. NDR region 504 may be understood as exhibiting a negative resistance in that I-V curves in those regions exhibit a decreasing current as the voltage is increased.

In particular, FIG. 5c shows an I-V curve characterizing the state change across selector device 206 induced by varying voltage $V_s$ across resistor-selector pair 510. As shown in FIG. 5c, OFF-state 508, characterized by a high resistance/low conductivity state may occur when $V_{DEV}$ falls below $V_t$. Note the absence of a filament 406 in selector device 206 while in OFF-state 508. As the voltage across selector-device 206 is increased and eventually exceeds $V_t$, selector device 206 may enter ON-state 506 characterized by low resistance/high conductivity. This high conductivity state 506 may be caused due to formation of filament 406 in selector device 206. The transition between OFF-state 508 and ON-state 506 may occur via NDR state 504. Once selector device 206 is in ON-state 506, it may remain in such state until the voltage across selector device 206 falls below $V_h$, in which case, selector device 206 may transition to OFF-state 508 via dissolution of filament 406.

Figure 5D:
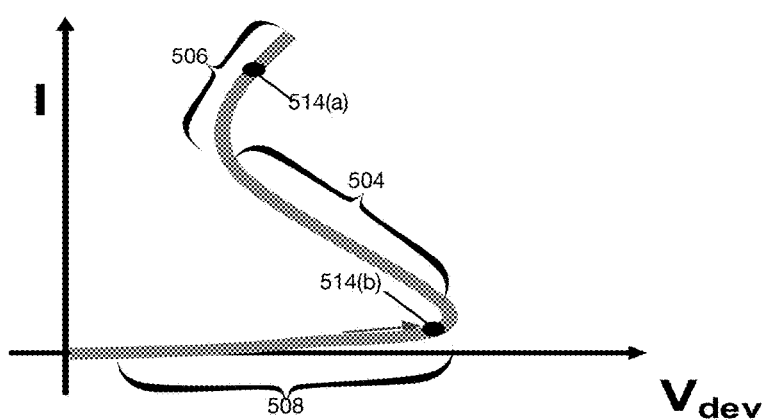
FIG. 5d shows an I-V curve of a selector device with respect to two particular operating points according to one embodiment of the present disclosure.

FIG. 5d shows an I-V curve of a selector device 206 with respect to two particular operating points according to one embodiment of the present disclosure. As shown in FIG. 5d, selector device 206 may operate in ON-state 506 at operating point 514(a) and transition to OFF-state 508 at operating point 514(b) via NDR regime 504. Thus, operating points 514(a)-514(b) may describe two discrete states (ON and OFF) for operation of selector device 206.

According to one embodiment, NDR region 504 resistance allows two states (ON-state 506 and OFF-state 508), each of which is activated or deactivated at different voltages. To exhibit a change in voltage without change in current, NDR region 504 is necessary. The I-V curve shown in FIG. 5d may exhibit a snap-back behavior, which is facilitated by NDR region 504. In particular, this behavior allows selector device 206 to exhibit a change in voltage without a corresponding change in current in order to maintain two states.

Figure 5E:
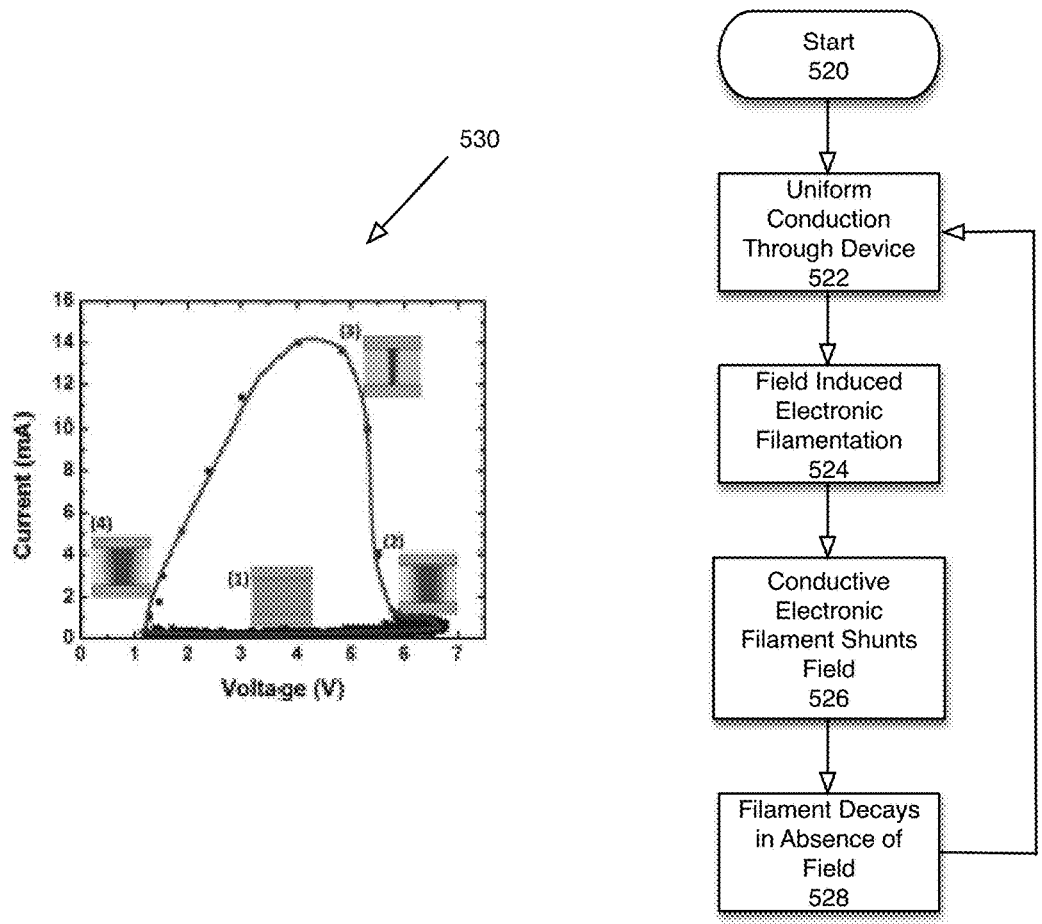
FIG. 5e is a flowchart depicting an oscillatory cycle of a selector device along with a corresponding phase diagram, according to one embodiment of the present disclosure.

FIG. 5e is a flowchart depicting an oscillatory cycle of a selector device according to one embodiment of the present disclosure. The flowchart shown in FIG. 5e corresponds to phase diagram 530. As shown in FIG. 5e, the process is initiated in 520. In 522, the selector device 206 exhibits uniform conduction. In 524, a filament 406 may be induced in the selector device 206 due to the introduction of an external field and associated voltage that exceeds $V_t$. In 526, the induced conductive electronic filament 406 shunts the electric field, thereby reducing the voltage across the selector device 206 and the voltage across the selector device 206 begins to decline. In 528, once the voltage across the selector device 206 falls below $V_h$, the filament 406 decays thereby increasing the resistivity of the selector device 206. In this case, the voltage across the selector device 206 may begin to rise again. Flow then continues with 522 and the cycle is repeated.

Figure 5F:
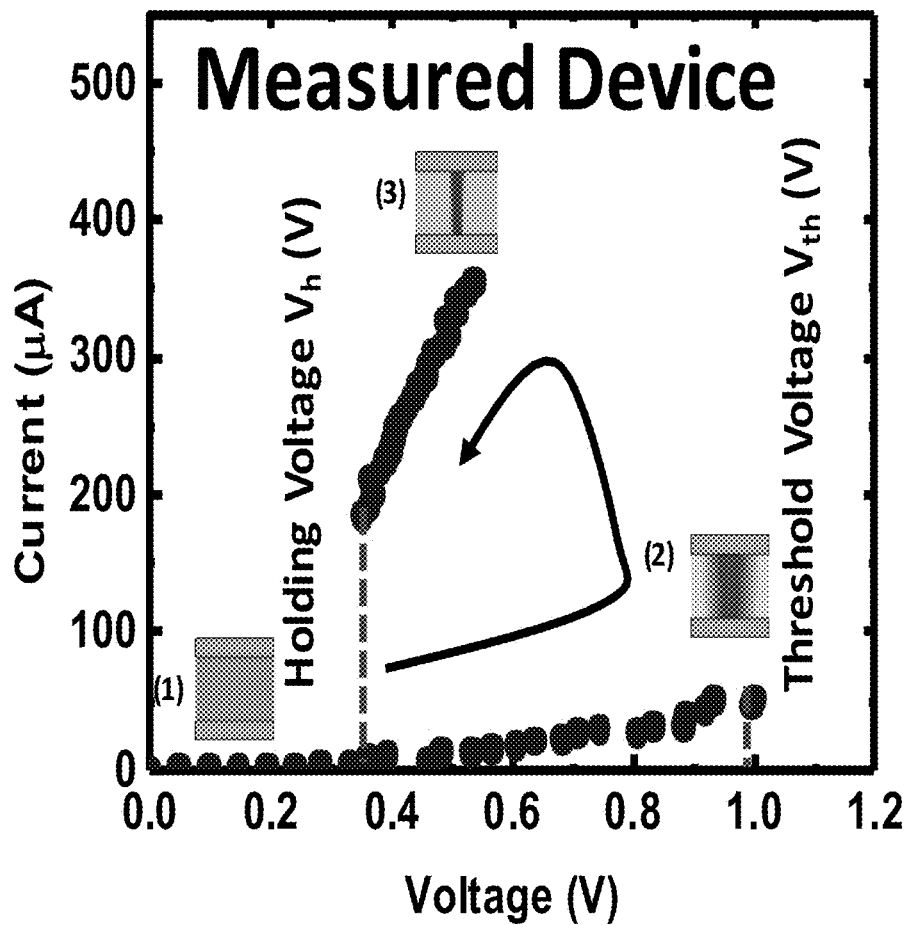
FIG. 5f shows data points of an I-V curve of a selector device in respective ON and OFF states according to one embodiment of the present disclosure.

FIG. 5f shows data points of an I-V curve of a selector device in respective ON and OFF states according to one embodiment of the present disclosure.

Figure 5G:
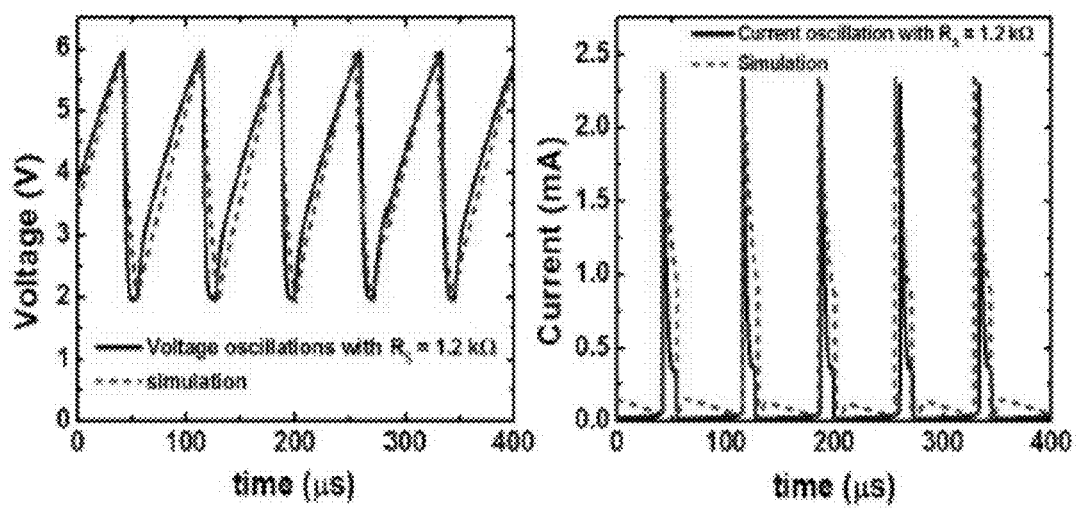
FIG. 5g illustrates time-domain voltage and current waveforms of oscillatory behavior of a selector device-resistance pair between an ON-state and an OFF-state according to one embodiment of the present disclosure.

FIG. 5g illustrates time-domain voltage and current waveforms of oscillatory behavior of a selector device-resistance pair between an ON-state and an OFF-state according to one embodiment of the present disclosure. As shown in FIG. 5g, once selector device 206 switches to ON-state 506(a) (temporary low-resistance state), the resistance of selector device 206 experiences a rapid decrease. Due to the voltage division enforced by the resistance in series, the voltage across selector device 206 drops. This drives selector device 206 to an I-V point in ON-state regime 506 that is lower than the holding voltages $V_h$ and the current $I_h$. Thus, conductive filament 406 is unstable and thus dissolves, driving selector device 206 back to OFF-state 508. Once in the high-resistance state, the voltage across selector device 206 starts increasing, eventually exceeding the threshold voltage, which causes selector device 206 to go back to ON-state 506. Thus, selector device 206 may undergo sustained oscillations between ON-state regime 506 and OFF-state regime 508.

While oscillatory behavior for selector device 206 has been described, if the source voltage $V_s$ exceeds a threshold voltage, oscillations may be suppressed. In particular, if $V_s > V_{osc-thresh}$, no sustained oscillations will occur and selector device 206 may be utilized in VFMC 200 to store a sustained state. fashion. This controlled behavior may be leveraged to write or read binary data to VFMC 200.

Figure 6A:
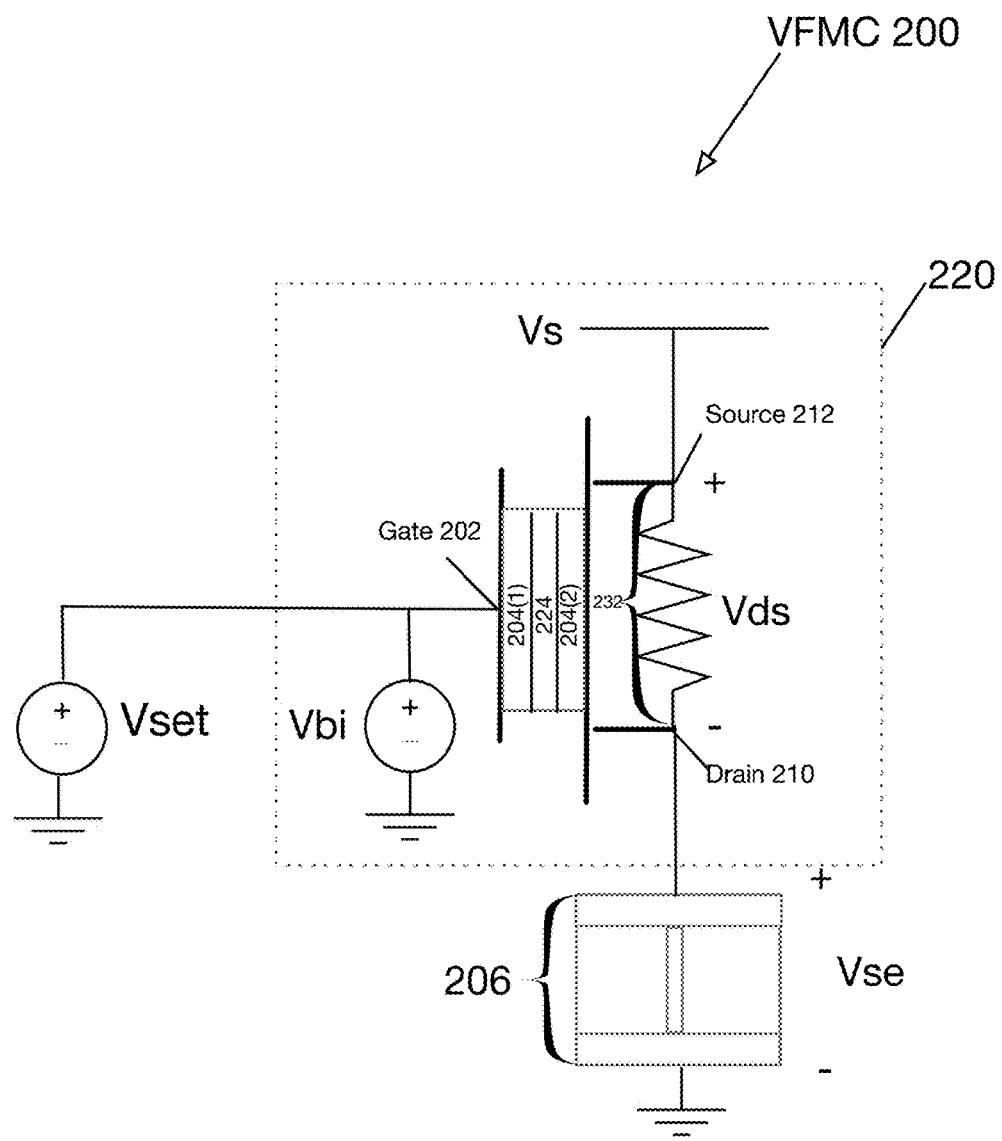
FIG. 6a is a schematic of a vertical flash memory cell in an OFF-state according to one embodiment of the present disclosure.

FIG. 6a is a schematic of a VFMC according to one embodiment of the present disclosure. The schematic shown in FIG. 6a further depicts how VFMC 200 may store a value (i.e., a digital '0' or digital '1'). During a write phase, a built-in voltage $V_{bi}$ may be established at gate 202 of VFMC 200. As previously described, $V_{bi}$ and an associated $Q_{bi}$ (built-in charge) at gate 202 may be induced by applying a large positive voltage $V_{set}$ between gate 202 and source 212 to cause tunneling of charge carriers (i.e., electrons) from gate through gate oxide layer 204(1) into charge trap layer 224. Alternatively, a hot carrier injection method may be employed in which in addition to applying a positive voltage $V_{set}$ between gate 202 and source 212, a positive voltage between drain 210 and source 212 $V_{DS}$ is also applied providing enough energy for charge carriers in channel 232 (induced by $V_{GS}$) to tunnel through tunneling oxide layer 204(2) into charge trap layer 224.

If $V_{bi} > V_t$ of CTVT 220, CTVT 220 will turn on and the source-drain conductance across channel 232 will increase. Thus, in this ON-state, due to the voltage-divider effect across the channel 232 of CTVT 220 and selector device 206, most of the voltage $V_s$ will fall across selector device 206, causing it on enter ON-state 506. Conversely, if $V_{bi} < V_t$ of CTVT 220, CTVT 220 will turn off and the source-drain conductance across channel 232 will decrease to near zero. Thus, in this OFF-state, due to the voltage-divider effect across the channel 232 of CTVT 220 and selector device, most of the voltage $V_s$ will fall across channel 232 of CTVT 220 and only a small voltage will fall across selector device 206, causing it on enter OFF-state 508.

A binary value may be represented by the state of selector device 206 as either in ON-state 506 or OFF-state 506. Thus, to set the state of VFMC 200 to ON-state 506, a large positive voltage may be applied to the gate 102 of CTVT 220 resulting a positive $V_{bi}$ at gate 202. On the other hand, in order to set the state of VFMC 200 to OFF-state 508, a large negative voltage may be applied to the gate 102 of CTVT 220 ultimately causing recombination of holes and electrons in charge trap layer 224, thereby neutralizing $V_{bi}$.

Figure 6B:
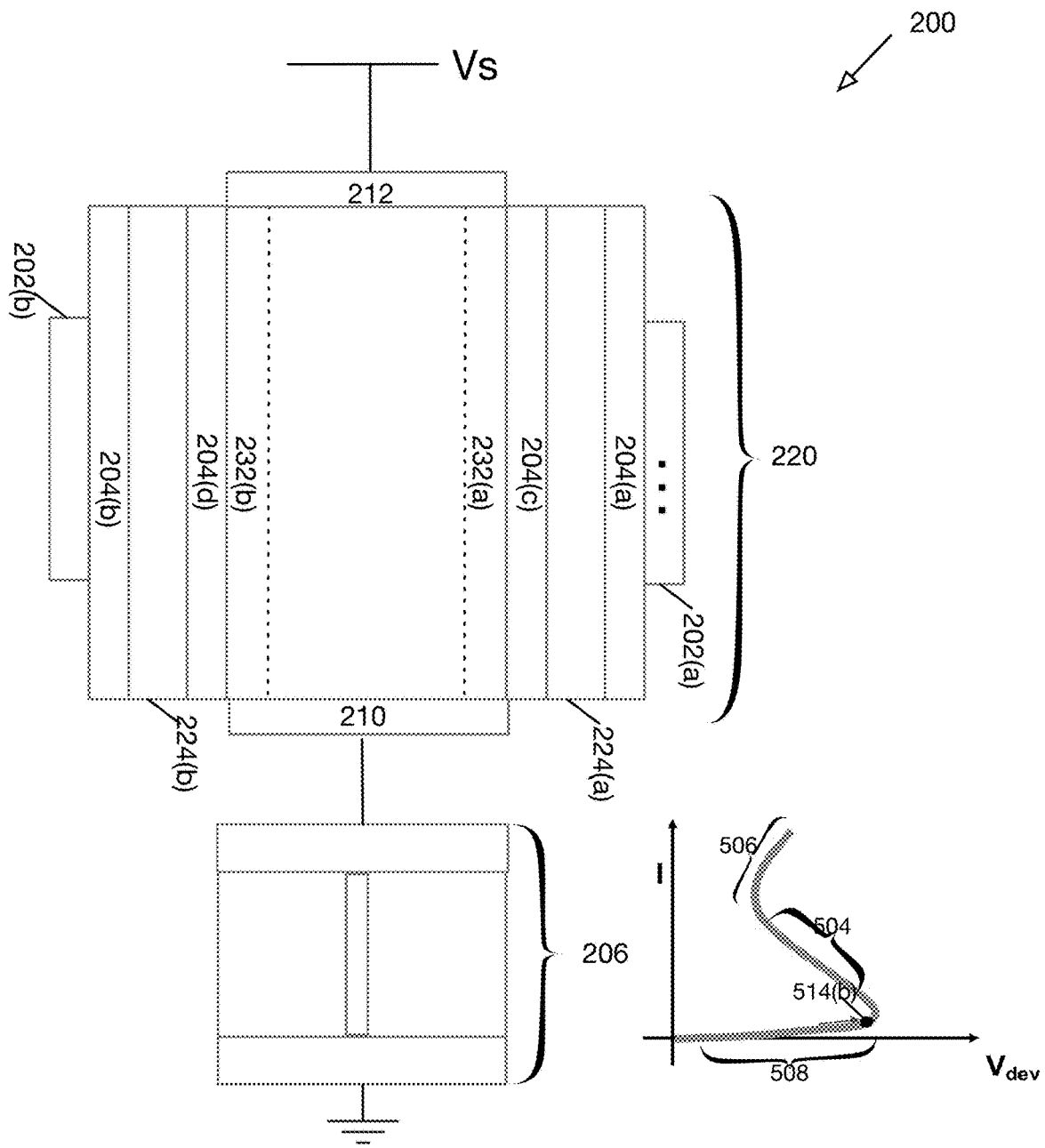
FIG. 6b depicts a vertical flash memory cell in an ON-state according to one embodiment of the present disclosure.

FIG. 6b is a schematic of a VFMC in an OFF-state according to one embodiment of the present disclosure.

Figure 6C:
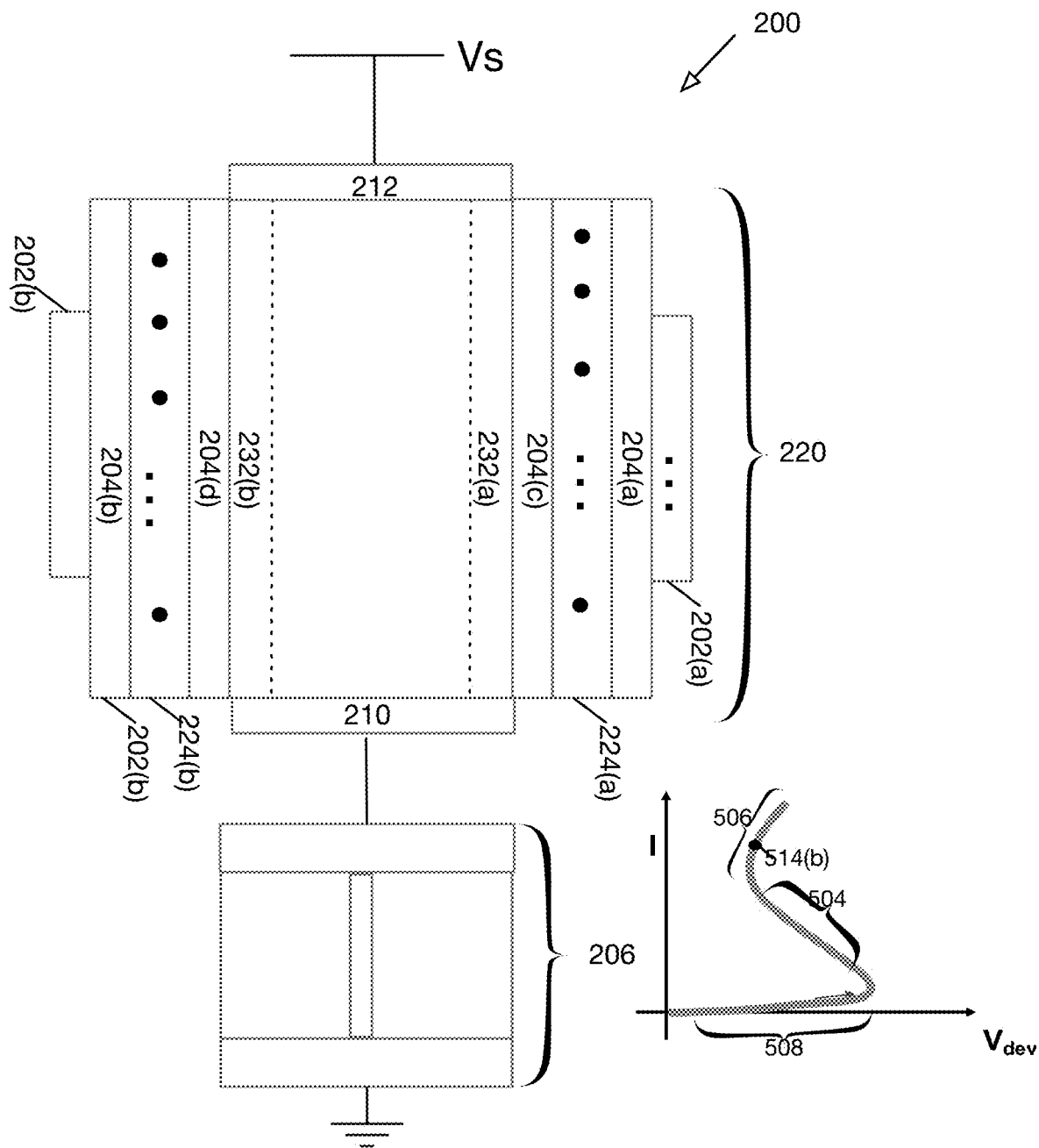
FIG. 6c shows two I-V curves for a charge trap vertical transistor in log scale in the vertical dimension according to one embodiment of the present disclosure.

FIG. 6c depicts a VFMC in an ON-state according to one embodiment of the present disclosure.

Figure 6D:
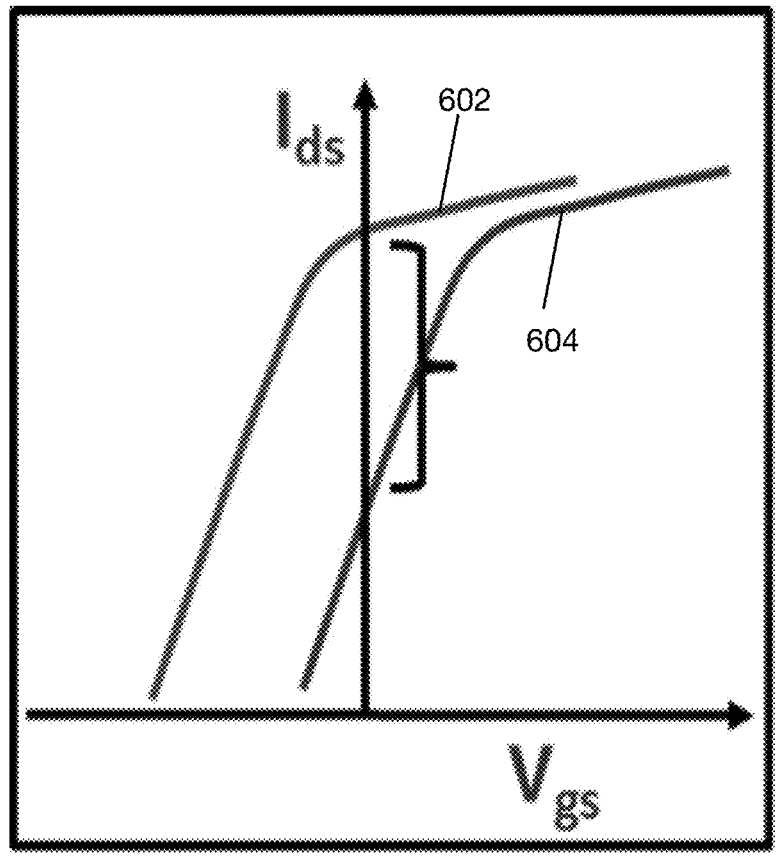
FIG. 6d shows two I-V curves for a CTVT in log scale in the vertical dimension according to one embodiment of the present disclosure.

FIG. 6d shows two I-V curves for a CTVT in log scale in the vertical dimension according to one embodiment of the present disclosure. FIG. 6d shows high conductance I-V curve 602 corresponding to an ON-state of CTVT 220 and high resistance (low conductance) I-V curve 604 corresponding to an OFF state of CTVT 220. In particular, I-V curves 602 and 604 correspond to two different threshold voltages $V_t$ of CTVT 220. This may be understood as follows. The built-in $Q_{bi}$ charge at gate 202 effectively modulates the threshold voltage $V_t$ of CTVT 220. That is the presence of $Q_{bi}$ in gate 202 acts as if a gate voltage were being applied to CTVT 220 modulating $V_t$ to $V_{t\text{-}eff}$. Thus, the drain 210 to source 212 conductance of CTVT 220 can be highly conductive (I-V curve 602) meaning $V_{t\text{-}eff} < 0$ or highly resistive (I-V curve 604) meaning that $V_t > 0$. Thus, the effective threshold voltage $V_{t\text{-}eff}$ associated with I-V curve 604 is higher than $V_{t\text{-}eff}$ of I-V 602 due to the fact that $V_{t\text{-}eff} < 0$ for curve 604 (i.e., a higher gate voltage is required for I-V curve 604 to turn on CTVT 220). Correspondingly, I-V curve 602 indicates that CTVT 220 turns on at an even lower voltage.

The presence of charge trap layer 224 allows for switching between I-V curves 602 and 604 by introducing carrier charges into charge trap layer 224. In particular, assuming, for example, $Q_{bi} > 0$, this is effectively applying a pre-existing positive charge at gate 202. This positive charge is not applied externally, but is due to the charges trapped in charge trap layer 224. In effect, CTVT 220 "sees" an effective $V_{gs}$ due to the existence of charges in charge trap layer 224. This situation corresponds to I-V curve 602 (i.e., conductive—high current at 0 bias) and $V_{t\text{-}eff} < 0$.

Conversely, if charges are removed from charge trap layer 224 due to recombination with holes (i.e., after applying a large negative voltage between gate 202 and source 212), this effectively causes $V_{t\text{-}eff} > 0$.

Thus, at 0 bias, for example, either a highly conductive drain 210 to source 212 impedance of CTVT 220 (I-V curve 602) or a highly resistive drain 210 to source 212 impedance (i.e., channel conductivity) of CTVT 220 (I-V curve 604) may be selected by either introducing charge carriers into charge trap layer 224 or causing the absence of charge carriers in charge trap layer 224. It will be understood that $V_{DS}$ is held constant and the resistance $$R_{DS} = \frac{V_{DS}}{I_{DS}}.$$

FIG. 6d also indicates how a write operation can be performed for VFMC 200. A high positive $V_{GS}$ will place VFMC 200 on I-V curve 602. Conversely, a high negative $V_{GS}$ will place VFMC 200 on I-V curve 604.

Figure 7A:
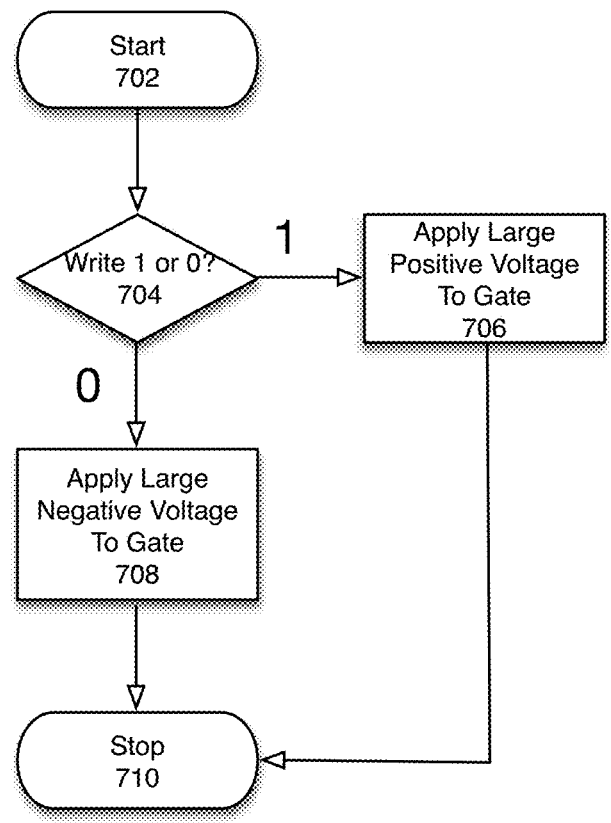
FIG. 7a is a flowchart depicting a technique for writing to a vertical flash memory cell according to one embodiment of the present disclosure.

FIG. 7a is a flowchart depicting a technique for writing to a VFMC according to one embodiment of the present disclosure. The process is initiated in 702. In 704 it is determined whether a digital '0' or '1' is to be written. If a '0' is to be written ('0' branch of 704), in 708, a large negative voltage is applied to gate 202 of CTVT 220. If a '1' is to be written ('1' branch of 704), in 706 a large voltage is applied to gate 202 of CTVT 220. In this instance, (assuming an N-material channel), electrons in gate 202 and/or channel 232 will tunnel through gate oxide layer 204(b)-204(c) or tunneling oxide layer 204(a)-204(b) and become trapped in charge trap layer 224. The process ends in 710.

Figure 7B:
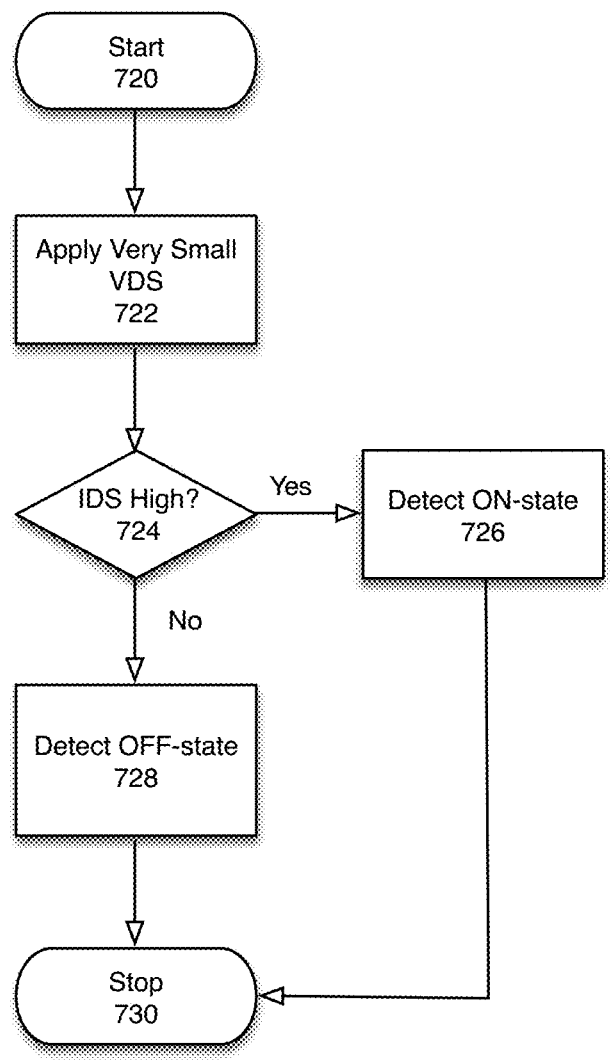
FIG. 7b is a flowchart depicting a technique for reading from vertical flash memory cell according to one embodiment of the present disclosure.

FIG. 7b is a flowchart depicting a technique for reading from VFMC according to one embodiment of the present disclosure. Referring again to FIG. 6d, a very small $V_{DS}$ may be applied to the drain 210 to source 212 of CTVT 220. Depending on the state of charge trap layer 224 (i.e., existence or absence of trapped charge carriers), $I_{DS}$ will either be at the intersection of I-V curve 602 with the vertical axis or the intersection of I-V curve 604 with the vertical axis. As previously discussed, these will be very different currents differing by orders of magnitudes (note that FIG. 6d shows a vertical axis on a log scale).

Referring to FIG. 7b, the read process is initiated in 720. In 722, a very small $V_{DS}$ is applied between the drain 210 and source 212 of CTVT 220. In 724, $I_{DS}$ is measured. If $I_{DS}$ is high ('Yes' branch of 724, in 726 an ON-state is detected. On the other hand, if $I_{DS}$ is low ('No' branch of 724, in 728 an OFF-state is detected. The process ends in 730.

Figure 8:
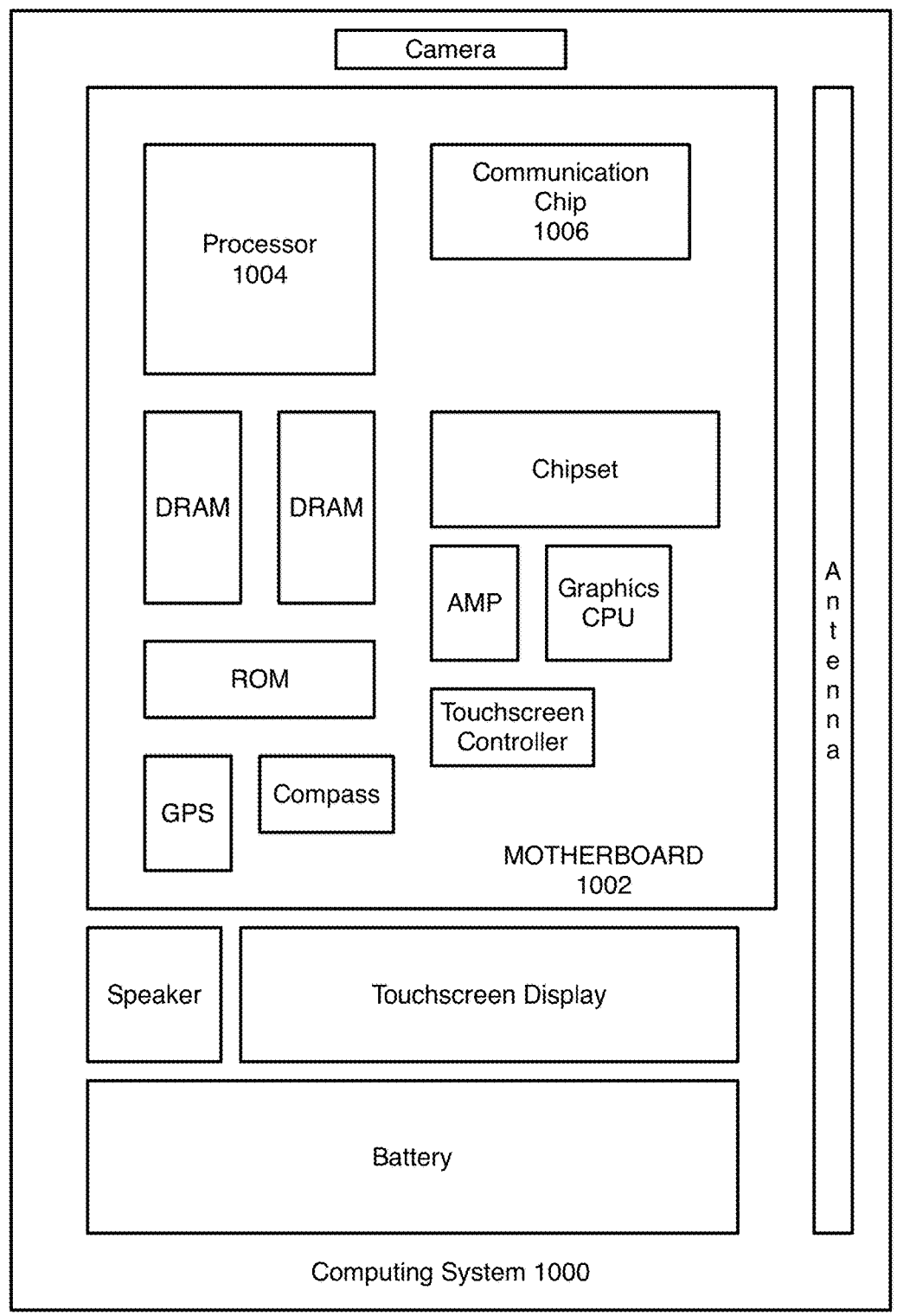
FIG. 8 illustrates a computing system implemented with integrated circuit structures and/or transistor devices formed using the techniques disclosed herein, in accordance with some embodiments of the present disclosure.

FIG. 8 illustrates a computing system implemented with integrated circuit structures and/or transistor devices formed using the techniques disclosed herein, in accordance with some embodiments of the present disclosure. Computing system 1000 may employ a number of VFMCs 200, or other back-end memory cells as provided herein. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices configured in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices configured as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices configured as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following examples pertain to further embodiments, from which numerous permutations and configurations will be apparent.

Example 1 is a memory cell comprising: a vertical flash transistor further comprising a metal gate node, a semiconductor layer, a source node electrically coupled to said semiconductor layer and a drain node electrically coupled to said semiconductor layer; and a two-terminal selector device said selector device having a threshold voltage that changes in response to a channel resistance of said flash device, wherein a first terminal of said selector device is electrically coupled to said drain node of said vertical flash transistor; wherein said memory cell may selectively be operated in one of an ON-state and an OFF-state by modulating said channel resistance of said flash device.

Example 2 includes the subject matter of Example 1, wherein said vertical flash transistor further comprises: a gate oxide layer, said gate oxide layer electrically coupled to said metal gate node; a tunneling oxide layer, said tunneling oxide layer electrically coupled to said semiconductor layer; and, a charge trap layer, said charge trap layer electrically coupled to said gate oxide layer and said tunneling oxide layer.

Example 3 includes the subject matter of Example 2, wherein said channel resistance of said flash device is modulated by charge carriers tunneling through one of said gate oxide layer and said tunneling layer to said charge trap layer.

Example 4 includes the subject matter of any of the preceding Examples, wherein a write operation may be performed upon said memory cell to store a first binary value by setting a gate voltage of said vertical flash transistor to a positive value greater than a first threshold value, and to store a second binary value by setting said gate voltage to a negative value less than a second threshold value.

Example 5 includes the subject matter of any of the preceding Examples, wherein said selector device exhibits a voltage-dependent volatile resistance state change, said voltage-dependent volatile resistance state change occurs between a first state of said selector device and a second state of said selector device and said first binary value is represented by said first state and second binary value is represented by said second state.

Example 6 includes the subject matter of any of the preceding Examples, wherein setting a gate voltage of said vertical flash transistor to a positive value greater than a first threshold voltage causes charge carriers to tunnel through a gate oxide layer of said vertical flash transistor into a charge trap layer of said vertical flash transistor.

Example 7 includes the subject matter of any of Examples 3 through 6, wherein said charge carriers in said charge trap layer causes a built-in voltage to be established at a gate of said vertical transistor.

Example 8 includes the subject matter of Example 8, wherein said built-in voltage causes a high conductivity between said source node and said drain and absence of said built-in voltage causes a high resistivity between said source node and said drain node.

Example 9 includes the subject matter of any of the preceding Examples, wherein a voltage divider between said vertical flash transistor and said two-terminal selector device causes said selector device to be in an on state when a high conductivity is established between said source node and said drain node and said selector device to be in an off state when a high resistivity is established between said source node and said drain node.

Example 10 includes the subject matter of any of the preceding Examples, wherein one of a N-type channel and a P-type channel may be formed in said vertical flash transistor.

Example 11 is an integrated circuit comprising the memory cell according to any of Examples 1 through 10. The integrated circuit may be, for instance, a processor or a communication chip or chip-set or a memory chip. In still further examples, a computing system includes the integrated circuit comprising said memory cell.

Example 12 is a memory cell comprising: a field effect transistor further comprising a metal gate node, a semiconductor layer, a charge trap layer interposed between said gate node and said semiconductor layer, a source node electrically coupled to said semiconductor layer and a drain node electrically coupled to said semiconductor layer; and a selector device coupled in series with said field effect transistor, said selector device configured to exhibit a voltage-dependent volatile resistance state change; wherein said memory cell may selectively be operated in one of an ON-state and an OFF-state by modulating said channel resistance of said field effect transistor by causing a tunneling of charge carriers into said charge trap layer.

Example 13 includes the subject matter of Example 12, wherein said field effect transistor further comprises a first oxide layer electrically coupled to said gate node and a second oxide layer electrically coupled to said semiconductor and said charge trap layer.

Example 14 includes the subject matter of Example 12 or 13, wherein a write operation may be performed upon said memory cell to store a first binary value by setting a gate node voltage to a positive value greater than a first threshold value and a second binary value by setting said gate node voltage to a negative value less than a second threshold value.

Example 15 includes the subject matter of Example 14, wherein setting said gate node voltage to a positive value greater than said first threshold value causes charge carriers to quantum mechanically tunnel through said first oxide layer into said charge trap layer causing a net charge in said charge trap layer and said setting said gate node voltage to a negative value less than said second threshold value causes a recombination in said charge trap layer removing said net charge.

Example 16 includes the subject matter of Example 15, wherein said net charge causes a built-in voltage to be established at said gate of field effect transistor.

Example 17 includes the subject matter of Example 16, wherein a first built-in voltage causes a high conductivity between said source node and said drain node and a second built-in voltage causes a high resistivity between said source node and said drain node.

Example 18 includes the subject matter of any of Examples 12 through 17, wherein said voltage-dependent volatile resistance state change occurs between a first state of said selector device and a second state of said selector device and said first binary value is represented by said first state and second binary value is represented by said second state.

Example 19 is an integrated circuit comprising the memory cell according to any of Examples 12 through 18.

The integrated circuit may be, for instance, a processor or a communication chip or chip-set or a memory chip.

Example 20 is a computing system comprising: a motherboard, wherein said motherboard further comprises a processor, a communication chip, and a memory cell. The memory cell includes a vertical flash transistor further comprising a metal gate node, a semiconductor layer, a source node electrically coupled to said semiconductor layer and a drain node electrically coupled to said semiconductor layer; and a two-terminal selector device said selector device having a threshold voltage that changes in response to a channel resistance of said flash device. A first terminal of said selector device is electrically coupled to said drain node of said vertical flash transistor; wherein said memory cell may selectively be operated in one of an ON-state and an OFF-state by modulating said channel resistance of said flash device.

Example 21 includes the subject matter of Example 20, wherein a write operation may be performed upon said memory cell to store a first binary value by setting a gate node voltage to a positive value greater than a first threshold value and a second binary value by setting said gate node voltage to a negative value less than a second threshold value.

Example 22 includes the subject matter of Example 20 or 21, wherein a voltage-dependent volatile resistance state change occurs between a first state of said selector device and a second state of said selector device and said first binary value is represented by said first state and second binary value is represented by said second state.

The foregoing description of example embodiments of the disclosure has been presented for the purposes of illustration and description. It is not intended to be exhaustive or to limit the disclosure to the precise forms disclosed. Many modifications and variations are possible in light of this disclosure. It is intended that the scope of the disclosure be limited not by this detailed description, but rather by the claims appended hereto.

What is claimed is:

1. A memory cell comprising:
    a vertical flash transistor further comprising a metal gate node, a semiconductor layer, a source node electrically coupled to said semiconductor layer and a drain node electrically coupled to said semiconductor layer;
    a first two-terminal selector device, said first two-terminal selector device having a voltage-dependent resistance that changes in response to a channel resistance of said vertical flash transistor, wherein a first terminal of said first two-terminal selector device is electrically coupled to said drain node of said vertical flash transistor; and
    a second two-terminal selector device, said second two-terminal selector device having a voltage-dependent resistance that changes in response to a channel resistance of said vertical flash transistor, wherein a first terminal of said second two-terminal selector device is electrically coupled to said source node of said vertical flash transistor;
    wherein said memory cell is configured to operate in one of an ON-state and an OFF-state by modulating said channel resistance of said vertical flash transistor.

2. The memory cell according to claim 1, wherein said vertical flash transistor further comprises:
    a gate oxide layer, said gate oxide layer electrically coupled to said metal gate node;
    a tunneling oxide layer, said tunneling oxide layer electrically coupled to said semiconductor layer; and, a charge trap layer, said charge trap layer electrically coupled to said gate oxide layer and said tunneling oxide layer.

3. The memory cell according to claim 2, wherein said channel resistance of said vertical flash transistor is modulated by charge carriers tunneling through one of said gate oxide layer and said tunneling layer to said charge trap layer.

4. The memory cell according to claim 1, wherein said memory cell is configured to perform a write operation to store a first binary value by setting a gate voltage of said vertical flash transistor to a positive value greater than a first threshold value, and to store a second binary value by setting said gate voltage to a negative value less than a second threshold value.

5. The memory cell according to claim 4, wherein said first two-terminal selector device exhibits a voltage-dependent volatile resistance state change, said voltage-dependent volatile resistance state change occurs between a first state of said first two-terminal selector device and a second state of said first two-terminal selector device and said first binary value is represented by said first state and second binary value is represented by said second state.

6. The memory cell according to claim 1, wherein setting a gate voltage of said vertical flash transistor to a positive value greater than a first threshold voltage causes charge carriers to tunnel through a gate oxide layer of said vertical flash transistor into a charge trap layer of said vertical flash transistor.

7. The memory cell according to claim 3, wherein said charge carriers in said charge trap layer causes a built-in voltage to be established at a gate of said vertical transistor.

8. The memory cell according to claim 7, wherein said built-in voltage causes a high conductivity between said source node and said drain and absence of said built-in voltage causes a high resistivity between said source node and said drain node.

9. The memory cell according to claim 1, wherein a voltage divider between said vertical flash transistor and said first two-terminal selector device causes said first two-terminal selector device to be in an on state when a high conductivity is established between said source node and said drain node and said first two-terminal selector device to be in an off state when a high resistivity is established between said source node and said drain node.

10. The memory cell according to claim 1, wherein one of a N-type channel and a P-type channel is formed in said vertical flash transistor.

11. A memory cell comprising:
a field effect transistor further comprising a metal gate node, a semiconductor layer, a charge trap layer interposed between said gate node and said semiconductor layer, a source node electrically coupled to said semiconductor layer and a drain node electrically coupled to said semiconductor layer;
a first selector device coupled in series with said drain node of said field effect transistor, said first selector device configured to exhibit a voltage-dependent volatile resistance state change; and
a second selector device coupled in series with said source node of said field effect transistor, said second selector device configured to exhibit a voltage-dependent volatile resistance state change;
wherein said memory cell is configured to operate in one of an ON-state and an OFF-state by modulating said channel resistance of said field effect transistor by causing a tunneling of charge carriers into said charge trap layer.

12. The memory cell according to claim 11, wherein said field effect transistor further comprises a first oxide layer electrically coupled to said gate node and a second oxide layer electrically coupled to said semiconductor and said charge trap layer.

13. The memory cell according to claim 11 wherein said memory cell is configured to perform a write operation to store a first binary value by setting a gate node voltage to a positive value greater than a first threshold value and a second binary value by setting said gate node voltage to a negative value less than a second threshold value.

14. The memory cell according to claim 13, wherein setting said gate node voltage to a positive value greater than said first threshold value causes charge carriers to quantum mechanically tunnel through said first oxide layer into said charge trap layer causing a net charge in said charge trap layer and said setting said gate node voltage to a negative value less than said second threshold value causes a recombination in said charge trap layer removing said net charge.

15. The memory cell according to claim 14, wherein said net charge causes a built-in voltage to be established at said gate of the field effect transistor.

16. The memory cell according to claim 15, wherein a first built-in voltage causes a high conductivity between said source node and said drain node and a second built-in voltage causes a high resistivity between said source node and said drain node.

17. The memory cell according to claim 13, wherein said voltage-dependent volatile resistance state change of the first selector device occurs between a first state of said first selector device and a second state of said first selector device and said first binary value is represented by said first state and second binary value is represented by said second state.

18. A computing system comprising:
a motherboard, wherein said motherboard includes
a processor,
a communication chip, and
a memory cell, the memory cell including
a vertical flash transistor further comprising a metal gate node, a semiconductor layer, a source node electrically coupled to said semiconductor layer and a drain node electrically coupled to said semiconductor layer;
a first two-terminal selector device, said first two-terminal selector device having a voltage-dependent resistance that changes in response to a channel resistance of said vertical flash transistor, wherein a first terminal of said first two-terminal selector device is electrically coupled to said drain node of said vertical flash transistor; and
a second two-terminal selector device, said second two-terminal selector device having a voltage-dependent resistance that changes in response to a channel resistance of said vertical flash transistor, wherein a first terminal of said second two-terminal selector device is electrically coupled to said source node of said vertical flash transistor;
wherein said memory cell is configured to operate in one of an ON-state and an OFF-state by modulating said channel resistance of said vertical flash transistor device.

19. The computing system according to claim 18, wherein a write operation may be performed upon said memory cell to store a first binary value by setting a gate node voltage to a positive value greater than a first threshold value and a second binary value by setting said gate node voltage to a negative value less than a second threshold value.

20. The computing system according to claim 19, wherein a voltage-dependent volatile resistance state change occurs between a first state of said first two-terminal selector device and a second state of said first two-terminal selector device and said first binary value is represented by said first state and second binary value is represented by said second state.

\* \* \* \* \*